(12) United States Patent
Levin et al.

(10) Patent No.: US 9,728,632 B2
(45) Date of Patent: Aug. 8, 2017

(54) DEEP SILICON VIA AS A DRAIN SINKER IN INTEGRATED VERTICAL DMOS TRANSISTOR

(71) Applicant: Tower Semiconductor Ltd., Migdal Haemek (IL)

(72) Inventors: Sharon Levin, Haifa (IL); Zachary K. Lee, Fremont, CA (US); Shye Shapira, Kirat (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 102 days.

(21) Appl. No.: 14/556,196

(22) Filed: Nov. 30, 2014

(65) Prior Publication Data

US 2015/0123194 A1    May 7, 2015

Related U.S. Application Data

(62) Division of application No. 13/484,238, filed on May 30, 2012, now Pat. No. 8,921,173.

(51) Int. Cl.

| | |
|---|---|
| *H01L 29/66* | (2006.01) |
| *H01L 29/78* | (2006.01) |
| *H01L 27/088* | (2006.01) |
| *H01L 21/8234* | (2006.01) |
| *H01L 27/092* | (2006.01) |
| *H01L 29/417* | (2006.01) |
| *H01L 29/49* | (2006.01) |
| *H01L 21/8238* | (2006.01) |

(52) U.S. Cl.
CPC .. *H01L 29/7809* (2013.01); *H01L 21/823487* (2013.01); *H01L 21/823885* (2013.01); *H01L 27/088* (2013.01); *H01L 27/0922* (2013.01); *H01L 29/41741* (2013.01); *H01L 29/4916* (2013.01); *H01L 21/82385* (2013.01); *H01L 21/823857* (2013.01)

(58) Field of Classification Search
CPC .................. H01L 29/7827; H01L 29/7801
USPC .................. 257/337, 339, E29.257
See application file for complete search history.

(56) References Cited

U.S. PATENT DOCUMENTS

| | | | |
|---|---|---|---|
| 4,914,051 A | 4/1990 | Huie et al. | |
| 6,130,458 A * | 10/2000 | Takagi | H01L 21/743 257/341 |
| 6,867,476 B2 * | 3/2005 | Lee | H01L 29/7809 257/288 |
| 7,560,808 B2 * | 7/2009 | Korec | H01L 24/14 257/691 |
| 7,575,977 B2 | 8/2009 | Levin et al. | |

(Continued)

*Primary Examiner* — Julia Slutsker
(74) *Attorney, Agent, or Firm* — Bever, Hoffman & Harms, LLP

(57) ABSTRACT

A vertical DMOS device implements one or more deep silicon via (DSV) plugs, thereby significantly reducing the layout area and on-resistance ($RDS_{ON}$) of the device. The DSV plugs extend through a semiconductor substrate to contact a conductively doped buried diffusion region, which forms the drain of the vertical DMOS device. Methods for fabricating the vertical DMOS device are compatible with conventional sub-micron VLSI processes, such that the vertical DMOS device can be readily fabricated on the same integrated circuit as CMOS devices and analog devices, such as lateral double-diffused MOS (LDMOS) devices.

9 Claims, 25 Drawing Sheets

(56) References Cited

U.S. PATENT DOCUMENTS

| | | |
|---|---|---|
| 2008/0023787 A1 | 1/2008 | Shimada et al. |
| 2008/0122025 A1 | 5/2008 | Roggenbauer et al. |
| 2010/0140698 A1* | 6/2010 | Roig-Guitart ....... H01L 29/0634 |
| | | 257/335 |

* cited by examiner

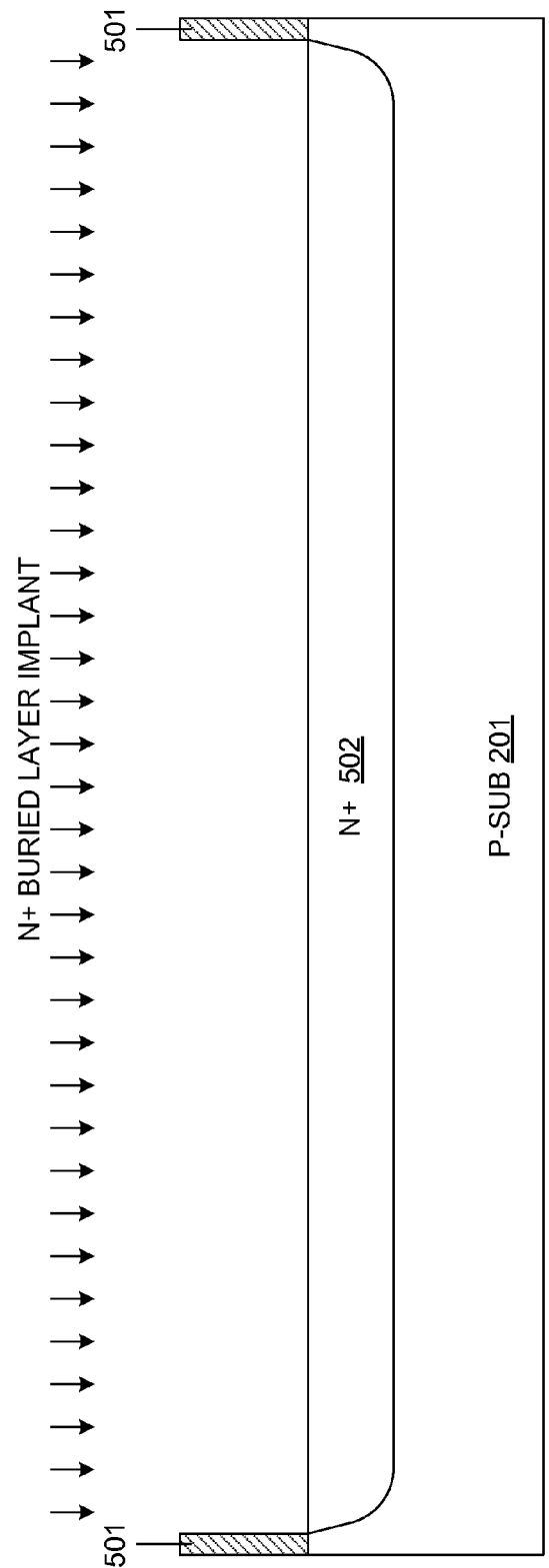

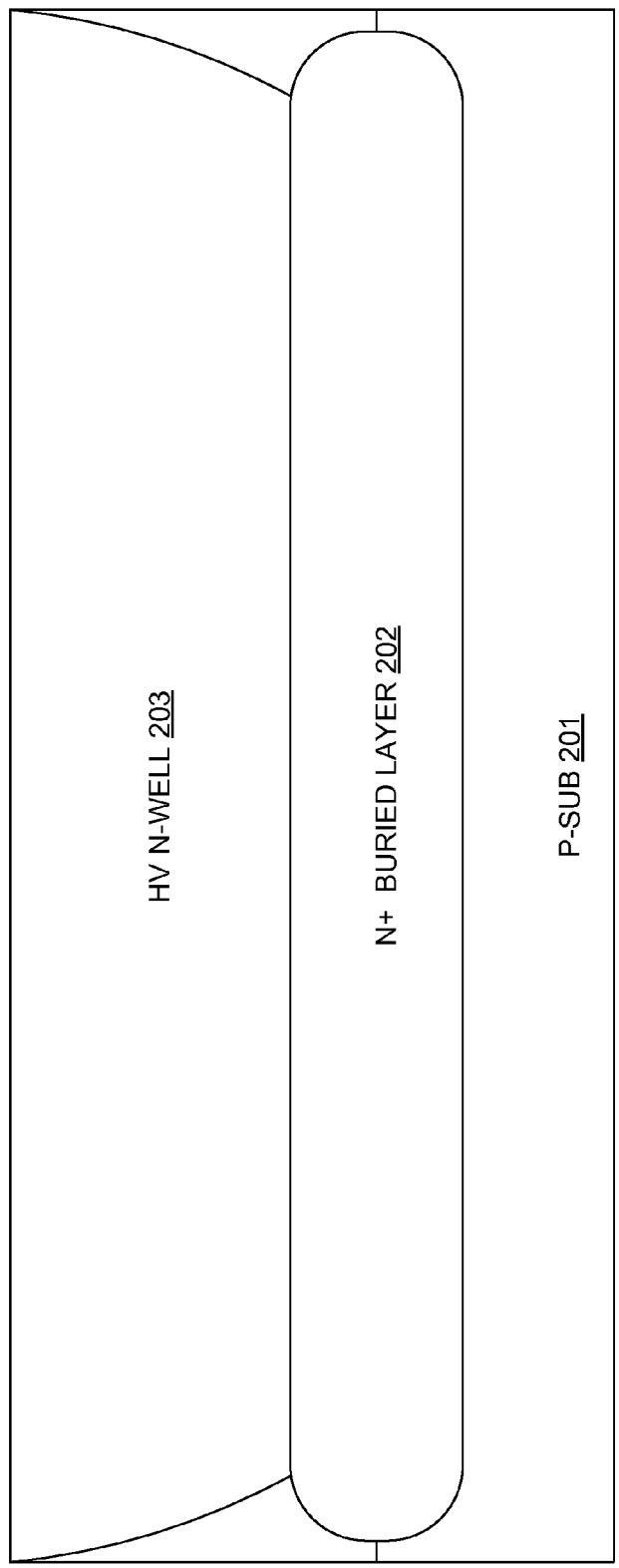

DEEP SILICON VIA AS A DRAIN SINKER IN INTEGRATED VERTICAL DMOS TRANSISTOR

RELATED APPLICATIONS

This application is a divisional application of U.S. patent application Ser. No. 13/484,238, filed May 30, 2012, entitled "Deep Silicon Via As A Drain Sinker In Integrated Vertical DMOS Transistor".

FIELD OF THE INVENTION

The present invention relates to the integration of deep silicon via plugs in a bipolar-CMOS-DMOS (BCD) process to lower the resistance of integrated double diffusion MOS (DMOS) transistors, and also sink the heat generated by these DMOS transistors.

RELATED ART

FIG. 1 is a cross sectional view of a conventional integrated vertical DMOS transistor 10, which includes P-substrate 11 and N-epitaxial layer 12, wherein the DMOS transistor 10 is formed in epitaxial pocket 12d, which is encompassed by the P+ isolation walls 14 and 16w. DMOS transistor 10 further includes a P-diffused bulk channel region 16d (which includes channel portion 16b), N+ source 20d, P+ contact region 22d, N+ buried layer 24d, N+ plug 26d, gate oxide 30, polysilicon gate 32d, field oxide 31, polysilicon field plate 34d, boron phosphorous silicate glass (BPSG) 33, source metal 35, P+ contact region 22w and contact to the N+ plug region 20b. Vertical DMOS transistor 10 is described in more detail in U.S. Pat. No. 4,914,051.

Conventional BCD processes use heavily doped buried layers (such as N+ buried layer 24d), subsequent silicon epitaxial growth (such as N-epitaxial layer 12) and heavily doped sinker implants and diffusions (such as N+ plug 26d) for contacting the buried layers from the top. However, diffused sinkers consume significant silicon area due to lateral diffusion, which effectively increases the on-resistance (Rdson) of the device. For this reason, the on-resistance of integrated vertical DMOS transistors is sometimes limited by the area & resistance of the diffused sinkers.

A diffused sinker consumes a significant silicon area due to the lateral diffusion, wherein the sinker width is about three times its depth (e.g., a 6 micron deep diffused sinker is about 16 microns in width). In addition, the resistance of the diffused sinker is strongly dependent on dopant concentration, carrier mobility, width, depth and junction temperature. A diffused sinker drawn as 4 microns by 100 microns, for instance, will have a typical resistance of 2.4 kOhm per squared micron and will consume an area of about 16×112 microns squared. As voltage ratings increase, the thickness of the epitaxial layer will also increase, which will further increase the required sinker area and the on-resistance of a resulting vertical DMOS transistor. Hence, diffused sinkers make the integration of the vertical DMOS transistor 10 non-profitable in terms of on-resistance when compared with a lateral device.

It would therefore be desirable to have a vertical DMOS transistor that overcomes the above described deficiencies associated with diffused sinkers.

SUMMARY

Accordingly, the present invention replaces the diffused sinkers of the prior art with deep silicon via (DSV) plugs, thereby significantly reducing the layout area of the vertical DMOS transistor. The DSV plugs significantly reduce the sinker resistance, even when used in combination with a thick epitaxial silicon process. As a result, improved isolation performance is provided for a smaller silicon layout area.

For example, a DSV plug of the present invention having a depth of about 6 microns is only 0.8×0.8 microns in area and has a resistance of about 60 Ohms. The DSV plug of the present invention can also be fabricated as a trench that forms a closed ring around the device, which will block parasitic lateral bipolar currents. Alternately, the DSV plug can be drawn as a hole, wherein the DSV plug can be part of the drain contact. The thermal conductivity of the metallic DSV plug is higher than the thermal conductivity of the monocrystalline silicon diffused sinkers of the prior art. As a result, the DSV plug of the present invention is better at sinking heat generated during normal operation of the vertical DMOS transistor.

The present invention also includes methods for fabricating a vertical DMOS device that includes one or more DSV plugs. These methods are largely compatible with conventional sub-micron VLSI processes, such that the vertical DMOS device can be fabricated at the same time as CMOS devices and analog devices, such as lateral double-diffused MOS (LDMOS) devices.

The present invention will be more fully understood in view of the following description and drawings.

DETAILED DESCRIPTION OF THE DRAWINGS

Figure 1:
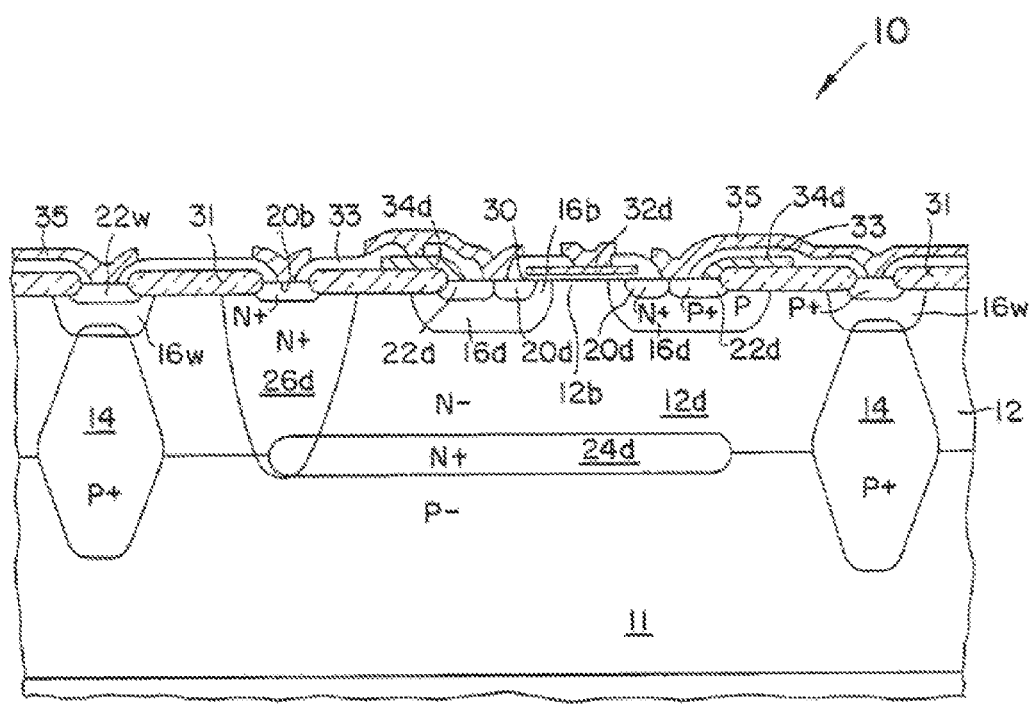
FIG. 1 is a cross-sectional view of a conventional integrated vertical DMOS transistor.
Figure 2:
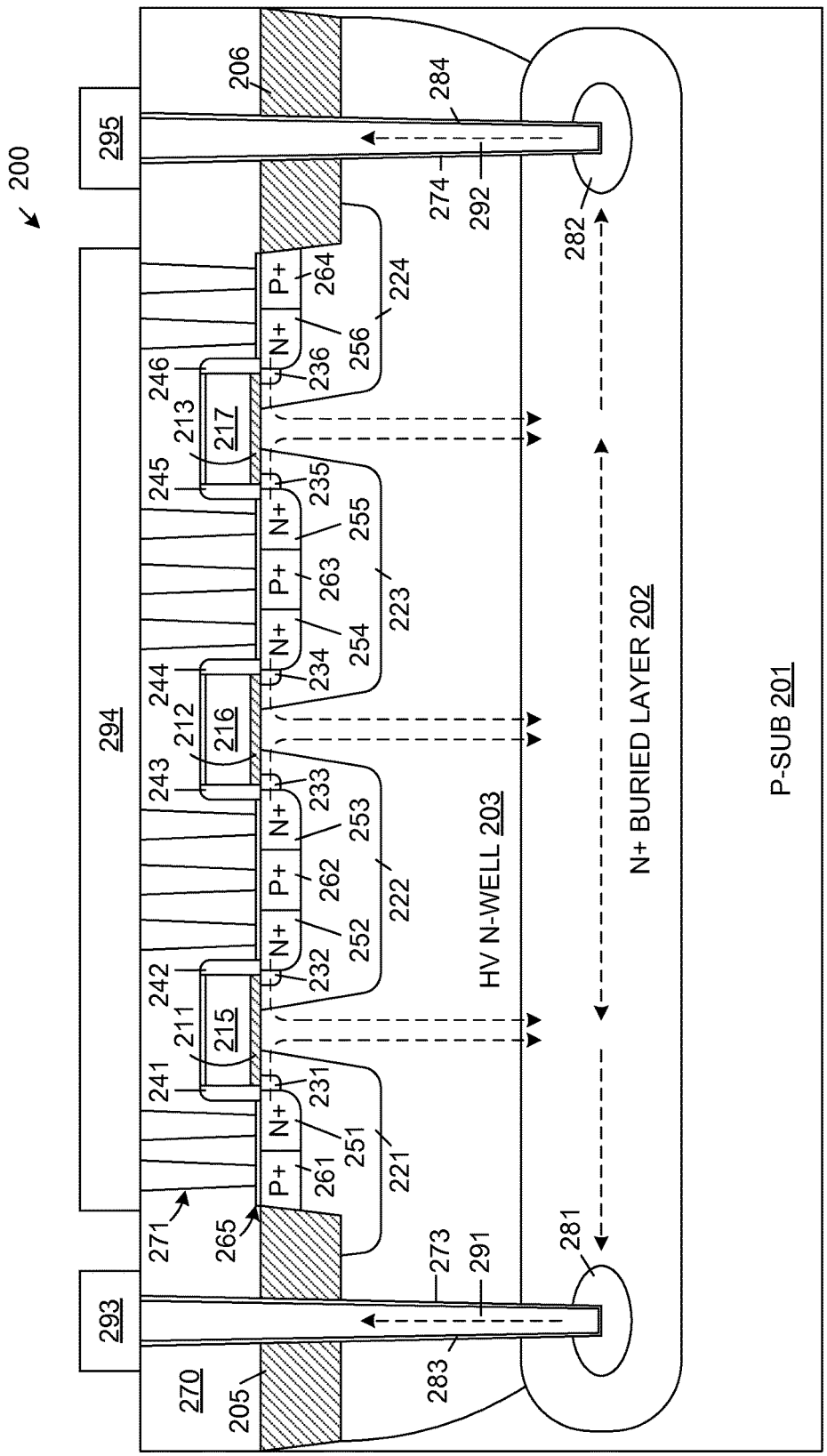
FIG. 2 is a cross-sectional view of a vertical DMOS device in accordance with one embodiment of the present invention.

FIG. 2 is a cross-sectional view of a vertical DMOS device 200 in accordance with one embodiment of the present invention. Vertical DMOS device 200 includes P-type semiconductor region 201, N+ buried layer 202, high voltage (HV) N-well 203, field isolation regions 205-206, gate dielectric regions 211-213, gate electrodes 215-217, P-type body regions 221-224, lightly doped N− source extension regions 231-236, dielectric sidewall spacers 241-246, N+ source contact regions 251-256, P+ body contact regions 261-264, silicide regions 265, pre-metal dielectric layer 270, conventional contacts 271, deep silicon trenches 273-274, N+ deep silicon diffusion regions 281-282, deep silicon trench liners 283-284, deep silicon via (DSV) plugs 291-292, and first metal layer (metal-1) traces 293-295. Although vertical DMOS device 200 is described with certain regions having n-type and p-type conductivity, it is understood that these conductivity types can be reversed in alternate embodiments.

In the described examples, p-type semiconductor region 201 is a P-type monocrystalline silicon wafer. P-type semiconductor region 201 can be an epitaxial or non-epitaxial layer in various embodiments. N+ buried layer 202 is formed below the upper surface of the semiconductor structure in a manner described in more detail below. High voltage N-well 203 extends from the upper surface of the semiconductor structure, and contacts N+ buried layer 202. Field isolation regions 205-206 define boundaries of the p-body regions 221-224. Field isolation regions 205-206 may be shallow trench isolation (STI) structures, local oxidation of silicon (LOCOs) structures or PBLOCOs structures.

Gate dielectric layers 211-213 and polysilicon gate electrodes 215-217 are formed over the upper surface of the high-voltage N-well 203, as illustrated. P-body regions 221-224 are formed in high-voltage N-well 203 in a manner described in more detail below, wherein the P-body regions 221-224 extend under gate electrodes 215-217, as illustrated.

Lightly doped N– extension regions 231-232, 233-234 and 235-236 also extend under gate electrodes 215, 216 and 217, respectively, as illustrated. As described in more detail below, N– extension regions 231-232, 233-234 and 235-236 are self-aligned with respect to the edges of gate electrodes 215, 216 and 217, respectively.

Dielectric sidewall spacers 241-242, 243-244 and 245-246 are located adjacent to edges of gate electrodes 215, 216 and 217, respectively. N+ source contact regions 251-256 extend under sidewall spacers 241-246, respectively, and are continuous with N– extension regions 231-236, respectively. N+ source contact regions 251-256 are self-aligned with respect to the edges of sidewall spacers 241-246, respectively.

P+ body contact regions 261-264 are located in P-body regions 221-224, respectively, as illustrated. Silicide regions 265 are formed on N+ source contact regions 251-255, P+ body contact regions 261-264 and gate electrodes 215-217. Conventional contacts 271 extend through pre-metal dielectric layer 270 and contact the N+ source contact regions 251-255 and P+ body contact regions 261-264, as illustrated. These conventional contacts 271 are joined by a trace 294 in the first metal layer. Similar (but separate) connections, which are not shown in the cross section of FIG. 2, are made to the gate electrodes 215-217.

N+ deep diffusion regions 281-282 are located in N+ buried layer 202, as illustrated. In general, N+ deep diffusion regions 281-282 are formed by performing a high dose N+ implant into deep trenches 273-274 that extend through pre-metal dielectric layer 270, field isolation regions 205-206, high-voltage N-well 203 and into N+ buried layer 202. This high dose N+ implant also forms N-type diffusion regions (not shown) on the sidewalls of deep trenches 273-274. Thermal drive of the N+ implant is implemented to avoid Schottky contact. Deep silicon trench liners 283-284 and deep silicon via plugs 291-292 are located in the deep trenches 273-274, as illustrated. In accordance with one embodiment, deep silicon trench liners 283-284 are thin metal liners (e.g, Ti/TiN), and deep silicon via plugs 291-292 are metal (e.g., tungsten) plugs. Traces 293 and 295 of the first metal layer are electrically connected to deep silicon via plugs 291 and 292, respectively.

In general, vertical DMOS device 200 operates as follows. Vertical DMOS device 200 is placed in a conductive state (i.e., turned on) by applying a voltage of about 5 Volts to the gate electrodes 215-217, a source voltage of about 0 Volts to metal-1 trace 294, and a drain voltage of about 0.1 Volts to metal-1 traces 293 and 295. Under these conditions, current flows along the paths indicated by the dashed lines in FIG. 2. That is current flows laterally from the N+ source regions 251-256 through the P-body regions 221-224 under gate electrodes 215-217, as illustrated. The current then flows vertically downward through high-voltage N-well 203 into N+ buried layer 202. The current then flows through N+ buried layer 202 and into deep silicon via plugs 291-292. Deep silicon via plugs 291-292 advantageously provide a low resistance path from N+ buried layer 202 to the multi-layer metal interconnect structure of the integrated circuit, which includes the first metal layer. In accordance with one embodiment, each deep silicon via plug 291-292 has a cross sectional layout area of about 0.8 microns×0.8 microns, and a depth of about 6 microns, and a resistance of about 60 Ohms. This is substantially less that the required layout area of a conventional heavily doped sinker implant, which typically requires a layout area of about 16 microns×16 microns, an exhibits a resistance of about 2.4 KOhm per squared micron. The deep silicon via plug of the present invention can have, for example, a rectangular or circular cross section.

Figure 3:
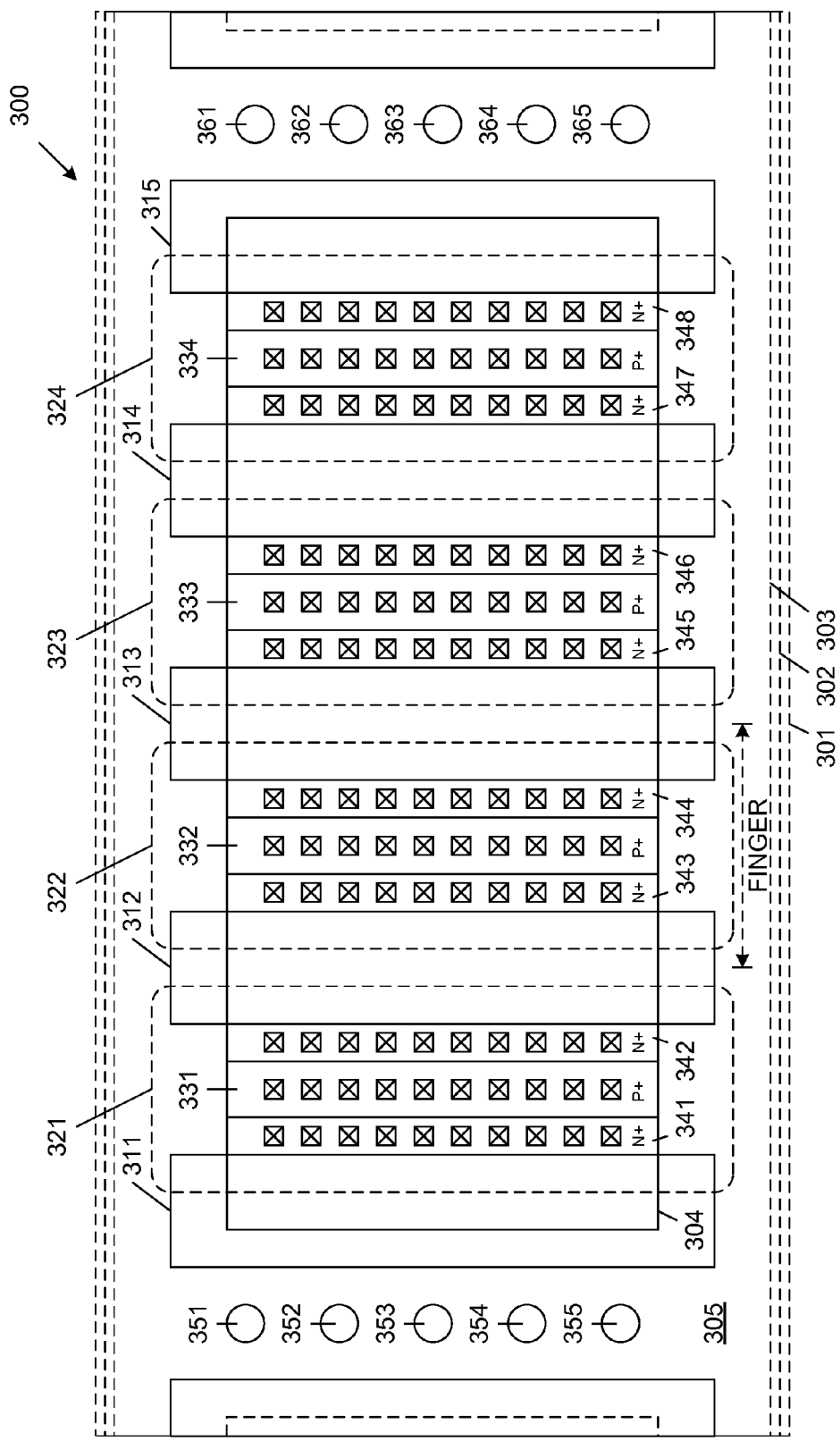
FIG. 3 is a top layout view of a vertical DMOS transistor having a plurality of fingers in accordance with one embodiment of the present invention.

FIG. 3 is a top layout view of a vertical DMOS transistor 300 having a plurality of fingers in accordance with one embodiment of the present invention. Vertical DMOS transistor 300 includes P-type substrate 301, N+ buried layer 302 and high-voltage N-well 303, which are similar to P-type substrate 201, N+ buried layer 202 and high-voltage N-well 203, respectively, of FIG. 2. A rectangular active region 304 is defined by a field dielectric region 305, wherein the field dielectric region 305 exists outside of the rectangular active region 304. Polysilicon gate electrodes 311-315, which are similar to gate electrodes 215-217 of FIG. 2, extend over portions of the active region 304 as illustrated. It is understood that gate dielectric (not shown) separates these polysilicon gate electrodes 311-315 from the underlying active region (in the same manner that gate dielectric layers 211-213 are located under gate electrodes 215-217 in FIG. 2). It is further understood that dielectric sidewall spacers (not shown), similar to dielectric sidewall spacers 241-246 of FIG. 2, may be located adjacent to polysilicon gate electrodes 311-315. Finally, it is understood that salicide (not shown) may be formed on top of polysilicon gate electrodes 311-315.

P-body regions 321-324, which are similar to P-body regions 221-224 of FIG. 2, are formed in high-voltage N-well 203, and extend under the polysilicon gate electrodes 311-315 as illustrated. P+ body contact regions 331-334, which are similar to P+ body contact regions 261-264 of FIG. 2, are formed in P-body regions 321-324, respectively, wherein each of the P+ body contact regions 331-334 is centrally located between adjacent polysilicon gate electrodes. N-type source regions 341-348 are formed in P-body regions 321-324, adjacent to the polysilicon gate electrodes 311-315, as illustrated. Each of the N-type source regions 341-348 includes an N+ source contact region (which is similar to the N+ source contact regions 251-256 of FIG. 2) and an N− source extension region (which is similar to the N− source extension regions 231-236 of FIG. 2). Conventional contacts to the P+ body contact regions 331-334 and the N-type source regions 341-348 (similar to conventional contacts 271 of FIG. 2) are shown as boxes containing X's in FIG. 3.

Deep silicon via plugs 351-355 and 361-365, which are similar to deep silicon via plugs 291-292 of FIG. 2, extend through field dielectric region 305 and high-voltage N-well 303 to contact N+ buried layer 302. Although not illustrated in FIG. 3, it is understood that deep silicon trench liners (similar to deep silicon trench liners 283-284 of FIG. 2) and N+ deep silicon diffusion regions (similar to N+ deep silicon diffusion regions 281-282 of FIG. 2) are used in combination with deep silicon via plugs 351-355 and 361-365.

Although ten deep silicon via plugs are illustrated in FIG. 3, it is understood that other numbers of deep silicon via plugs can be used in other embodiments. Moreover, although deep silicon via plugs are illustrated on two opposing sides of the vertical DMOS transistor 300 of FIG. 3, it is understood that deep silicon via plugs can be located on only one side, or on more than two sides, of the vertical DMOS transistor 300 in other embodiments. Furthermore, although the deep silicon via plugs illustrated in FIG. 3 have a circular cross section, it is understood that cross sections of other shapes can be used in other embodiments. For example, a deep silicon via plug in accordance with an alternate embodiment may have a rectangular cross section, which extends the full distance between deep silicon via plugs 351-355.

The layout of vertical DMOS transistor 300 advantageously exhibits a plurality of regular, repeatable rectangular structures (i.e., 'fingers'). For example, a 'finger' may be defined to include the elements included from the midpoint of one gate electrode to the midpoint of an adjacent gate electrode (see, FIG. 3). Using this definition, the vertical DMOS transistor 300 of FIG. 3 includes four 'fingers'. The number of fingers included in the vertical DMOS transistor 300 can be easily varied to provide a transistor of a desired current carrying capability.

Figure 4:
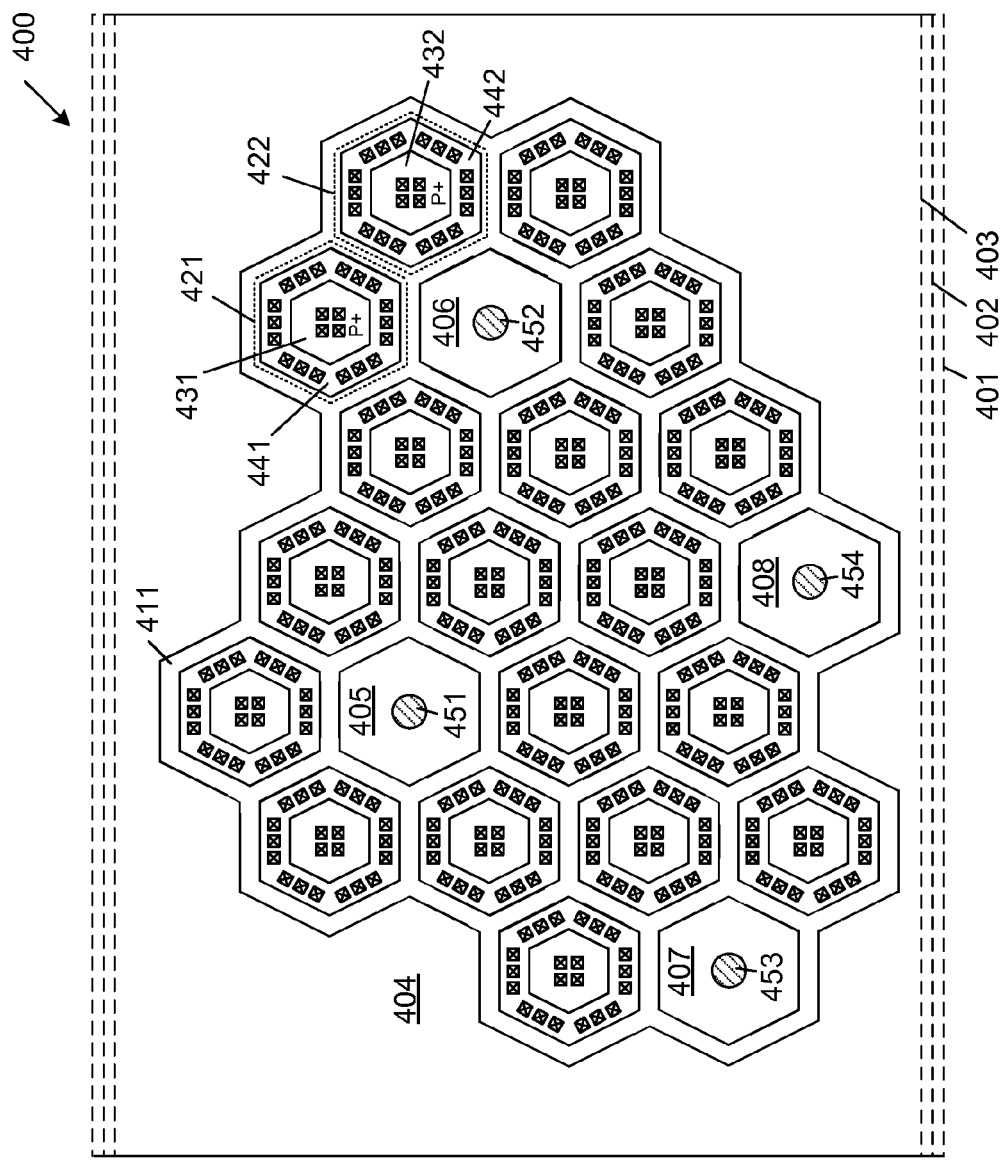
FIG. 4 is a top layout view of a vertical DMOS transistor having a plurality of hexagonal blocks in accordance with another embodiment of the present invention.

FIG. 4 is a top layout view of a vertical DMOS transistor 400 having a plurality of hexagonal blocks in accordance with another embodiment of the present invention. Vertical DMOS transistor 400 includes P-type substrate 401, N+ buried layer 402 and high-voltage N-well 403, which are similar to P-type substrate 201, N+ buried layer 202 and high-voltage N-well 203, respectively, of FIG. 2. An active region is defined by field dielectric regions 404-408. Polysilicon gate electrode 411, which is similar to gate electrodes 215-217 of FIG. 2, extends over portions of the active region as illustrated. In general, polysilicon gate electrode 411 is a continuous structure formed as a plurality of hexagonal structures. It is understood that gate dielectric (not shown) separates this polysilicon gate electrode 411 from the underlying active region (in the same manner that gate dielectric layers 211-213 are located under gate electrodes 215-217 in FIG. 2). It is further understood that dielectric sidewall spacers (not shown), similar to dielectric sidewall spacers 241-246 of FIG. 2, are located adjacent to polysilicon gate electrode 411. Finally, it is understood that salicide (not shown) is formed on top of polysilicon gate electrode 411.

P-body regions, such as P-body regions 421-422, are formed in high-voltage N-well 403, and extend under the polysilicon gate electrode 411 as illustrated. Note that the P-body regions of FIG. 4 are similar to the P-body regions 221-224 of FIG. 2. Although only two P-body regions 421-422 are shown in FIG. 4 (for clarity), it is understood that each hexagonal opening of polysilicon gate electrode 411 has a corresponding P-body region.

P+ body contact regions, such as P+ body contact regions 431 and 432, are formed in the P-body regions, such as P-body regions 421 and 422, as illustrated. Note that the P+ body contact regions of FIG. 4 are similar to the P+ body contact regions 261-264 of FIG. 2. Although only two P+ body contact regions 431-432 are labeled in FIG. 4 (for clarity), it is understood that the hexagonal regions in FIG. 4 that are similar to the P+ body contact regions 431-432 are in fact P+ body contact regions. As illustrated by FIG. 4, each of the P+ body contact regions is centrally located within a hexagonal opening in the polysilicon gate electrode 411.

N-type source regions, such as N-type source regions 441 and 442, are formed in P-body regions, such as P-body regions 421 and 422, as illustrated. Note that the N-type source regions of FIG. 4 are adjacent to the polysilicon gate electrode 411. Each of the N-type source regions of FIG. 4 includes an N+ source contact region (which is similar to the N+ source contact regions 251-256 of FIG. 2) and an N− source extension region (which is similar to the N− source extension regions 231-236 of FIG. 2). Although only two N-type source regions 441-442 are labeled in FIG. 4 (for clarity), it is understood that the hexagonal ring regions in FIG. 4 that are similar to the N-type source regions 441-442 are in fact N-type source regions.

Conventional contacts to the P+ body contact regions and the N-type source regions are shown as boxes containing X's in FIG. 4. Thus, each P+ body contact region includes four corresponding contacts and each N-type source region includes 18 corresponding contacts in FIG. 4.

Deep silicon via plugs 451-454, which are similar to deep silicon via plugs 291-292 of FIG. 2, extend through field dielectric regions 405-408, respectively, and through high-voltage N-well 403 to contact N+ buried layer 402. Although not illustrated in FIG. 4, it is understood that deep silicon trench liners (similar to deep silicon trench liners 283-284 of FIG. 2) and N+ deep silicon diffusion regions (similar to N+ deep silicon diffusion regions 281-282 of FIG. 2) are used in combination with deep silicon via plugs 451-454.

Although four cylindrical deep silicon via plugs 451-454 are illustrated in FIG. 4, it is understood that other numbers/shapes of deep silicon via plugs can be used in other embodiments. Moreover, although the vertical DMOS transistor 400 of FIG. 4 includes nineteen P-body regions and four deep silicon via plugs, it is understood that other ratios can be implemented in other embodiments. In addition, although the P-body regions have a hexagonal shape in FIG. 4, it is understood that other polygonal shapes (such as octagons, squares, etc.) can be implemented in other embodiments.

The layout of vertical DMOS transistor 400 advantageously exhibits a plurality of regular, repeatable hexagonal structures. The number of hexagonal structures included in the vertical DMOS transistor 400 can be easily varied to provide a transistor of a desired current carrying capability. Moreover, the layout of vertical DMOS transistor 400 allows this transistor to be easily 'tiled' with similarly laid out transistors.

The fabrication of the vertical DMOS transistor 200 on the same integrated circuit chip with low voltage CMOS transistors and a lateral DMOS transistor will now be described. The described fabrication process is substantially compatible with a conventional bipolar-CMOS-DMOS (BCD) process, as will become apparent in view of the following description.

Figure 5B:
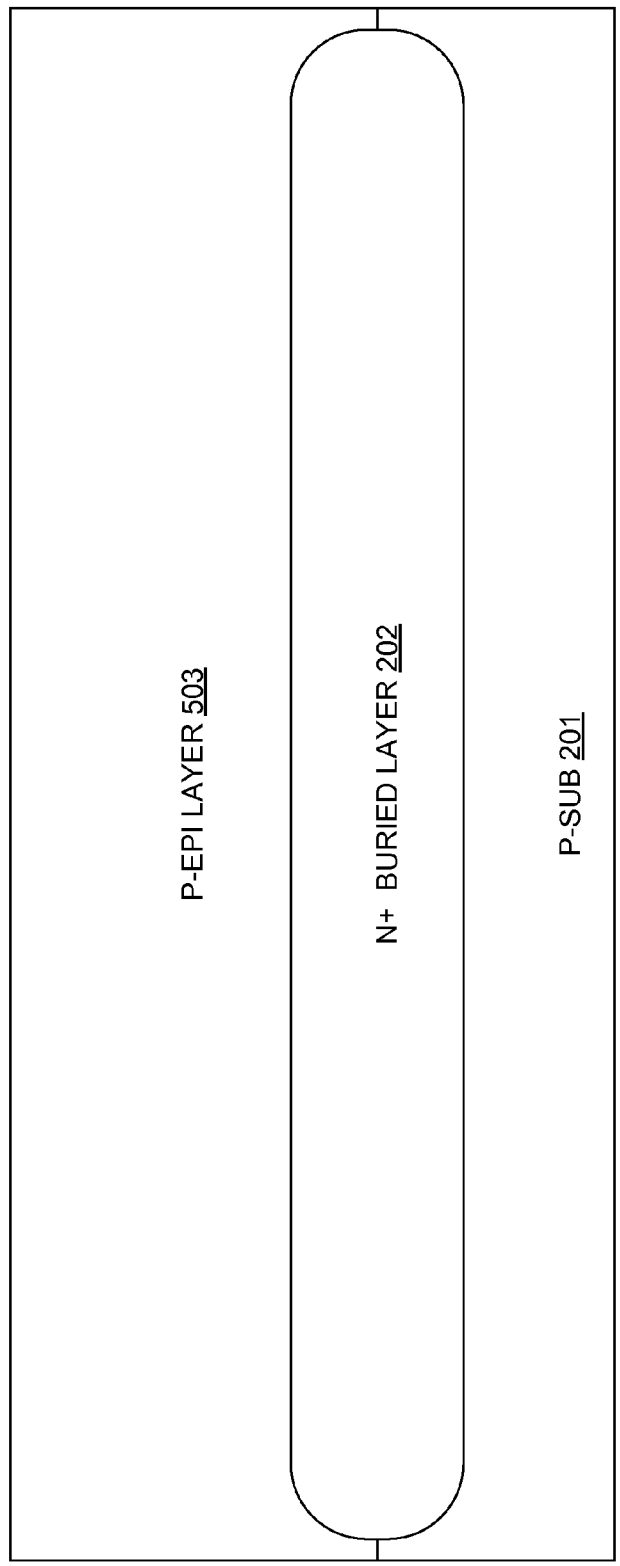
FIGS. 5A-5P are cross-sectional views showing a first portion of an integrated circuit chip during various processing steps, wherein a vertical DMOS transistor is fabricated in the first portion of the integrated circuit chip in accordance with one embodiment of the present invention.
Figure 5D:
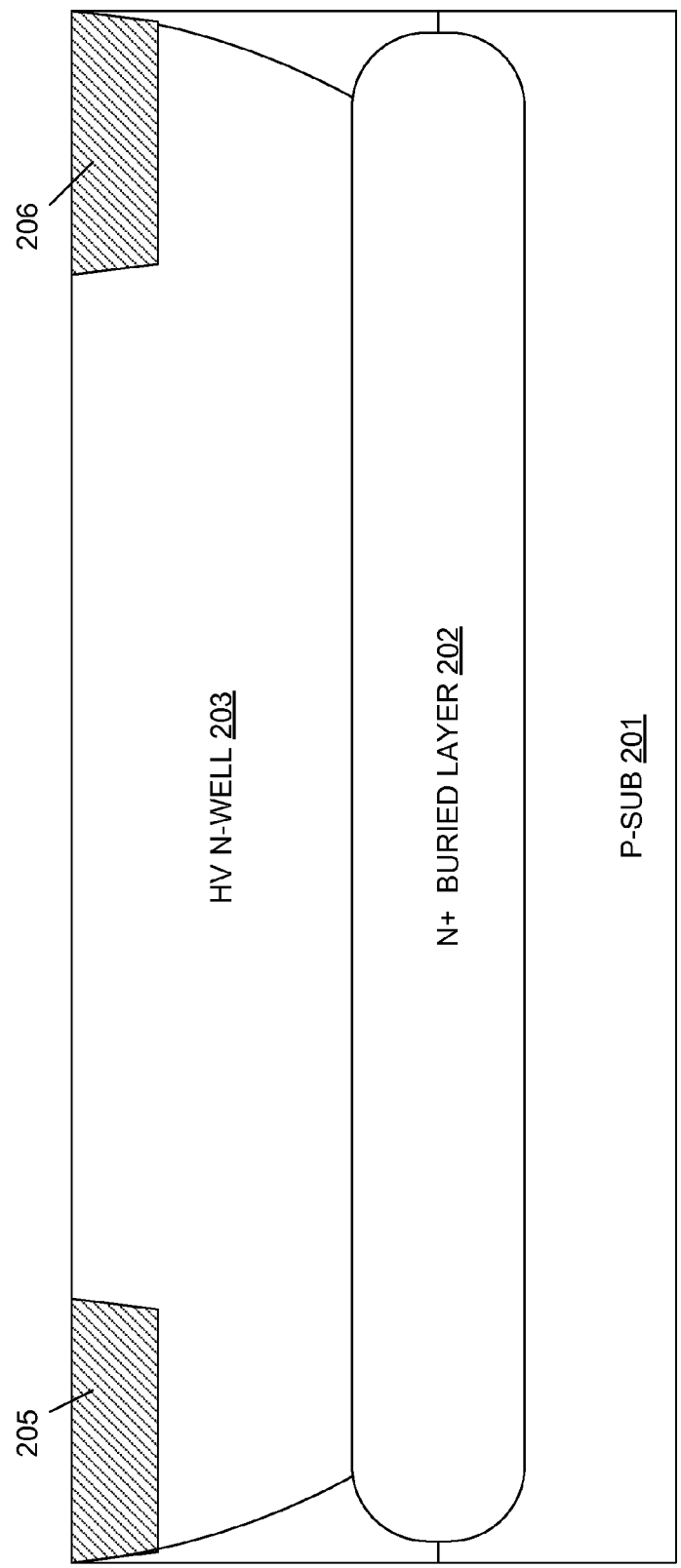
Figure 5E:
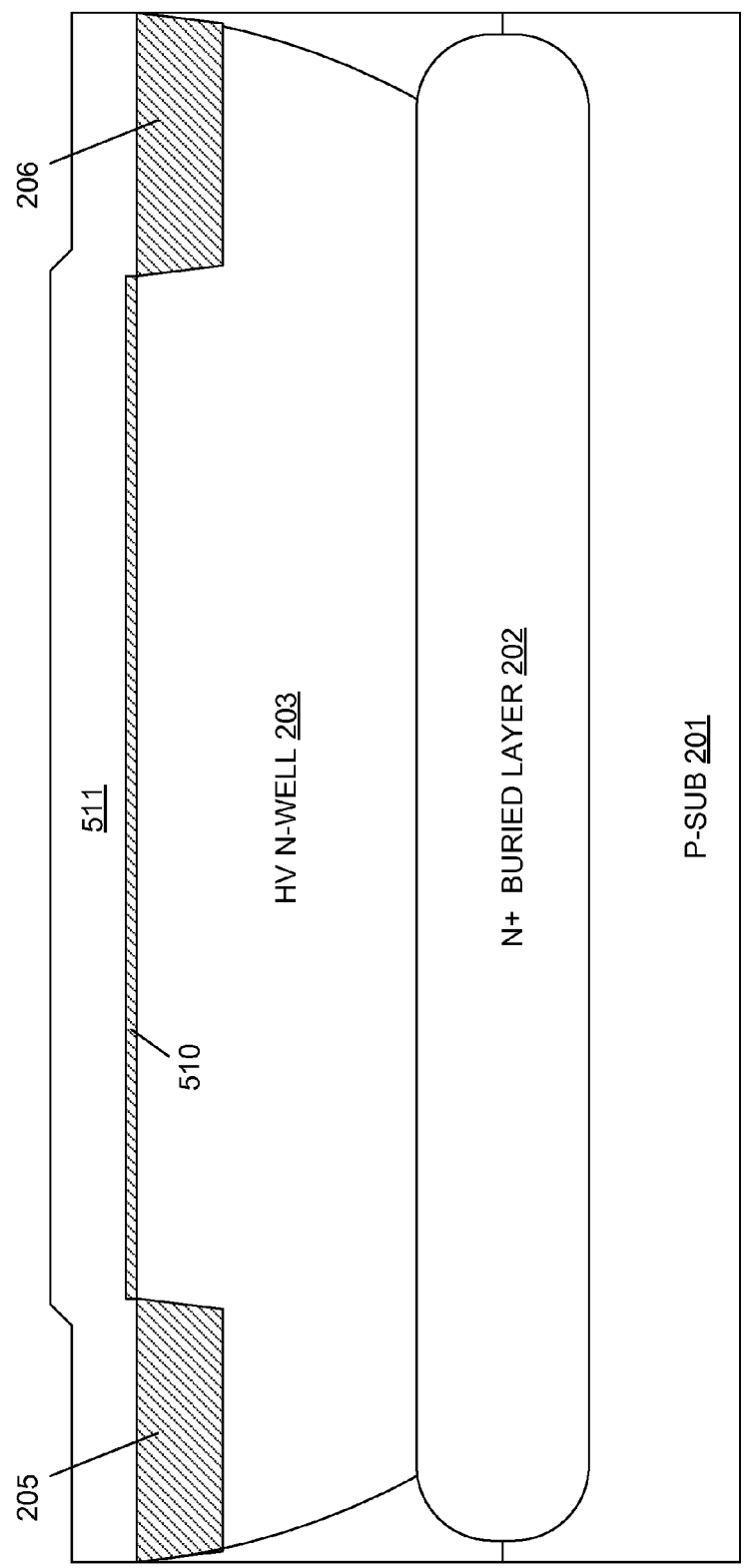
Figure 5F:
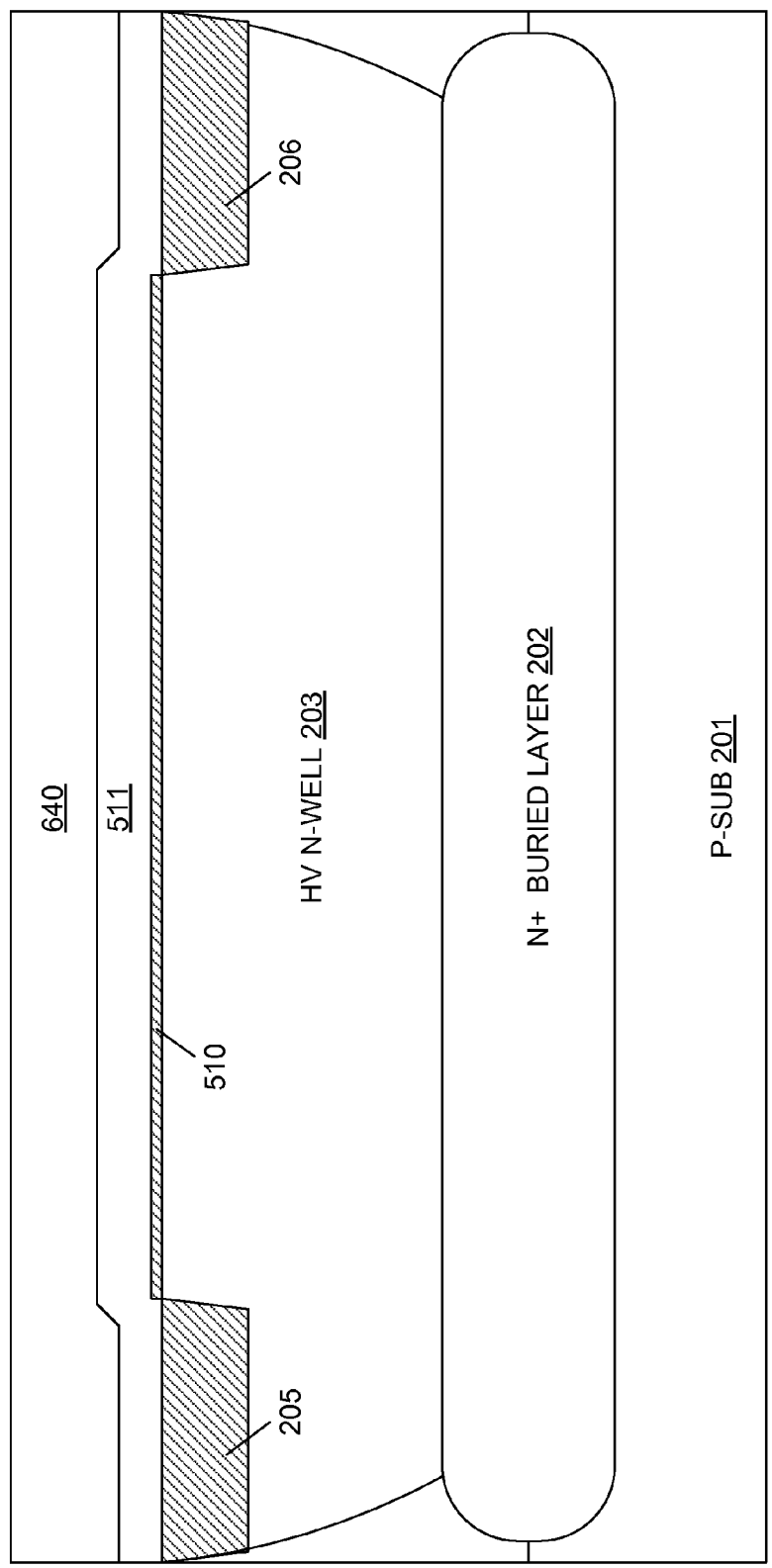
Figure 5G:
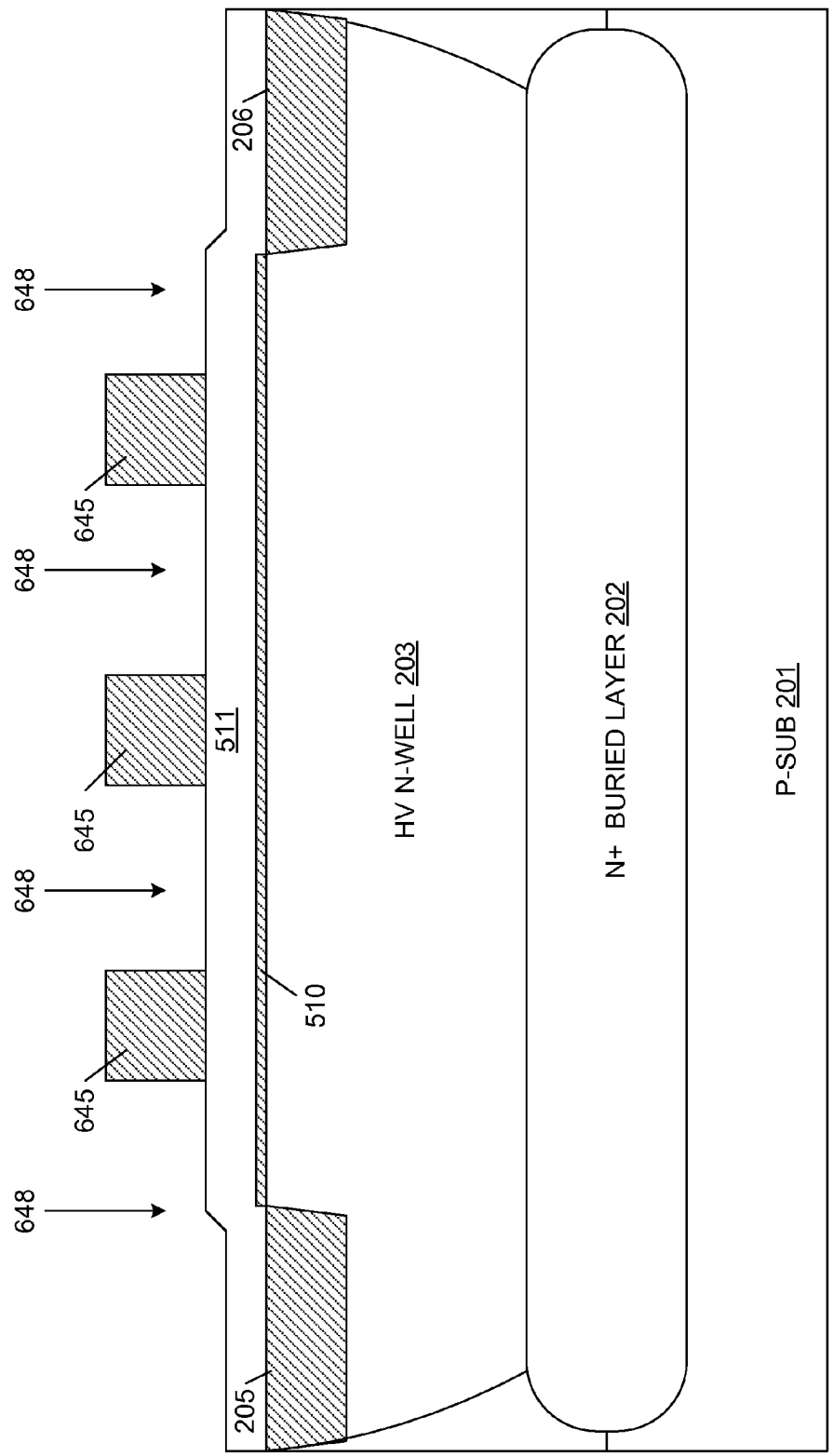
Figure 5H:
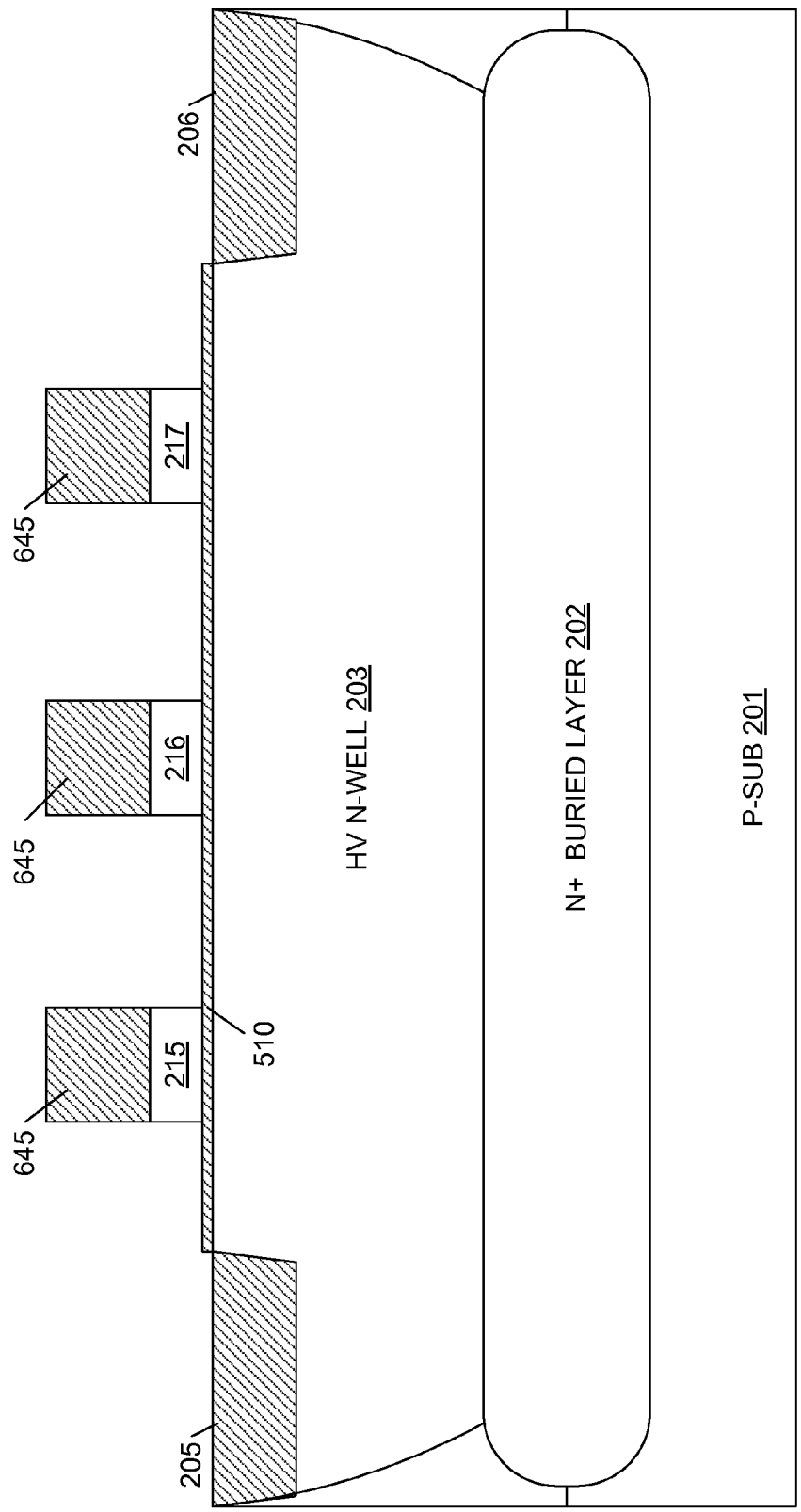
Figure 5I:
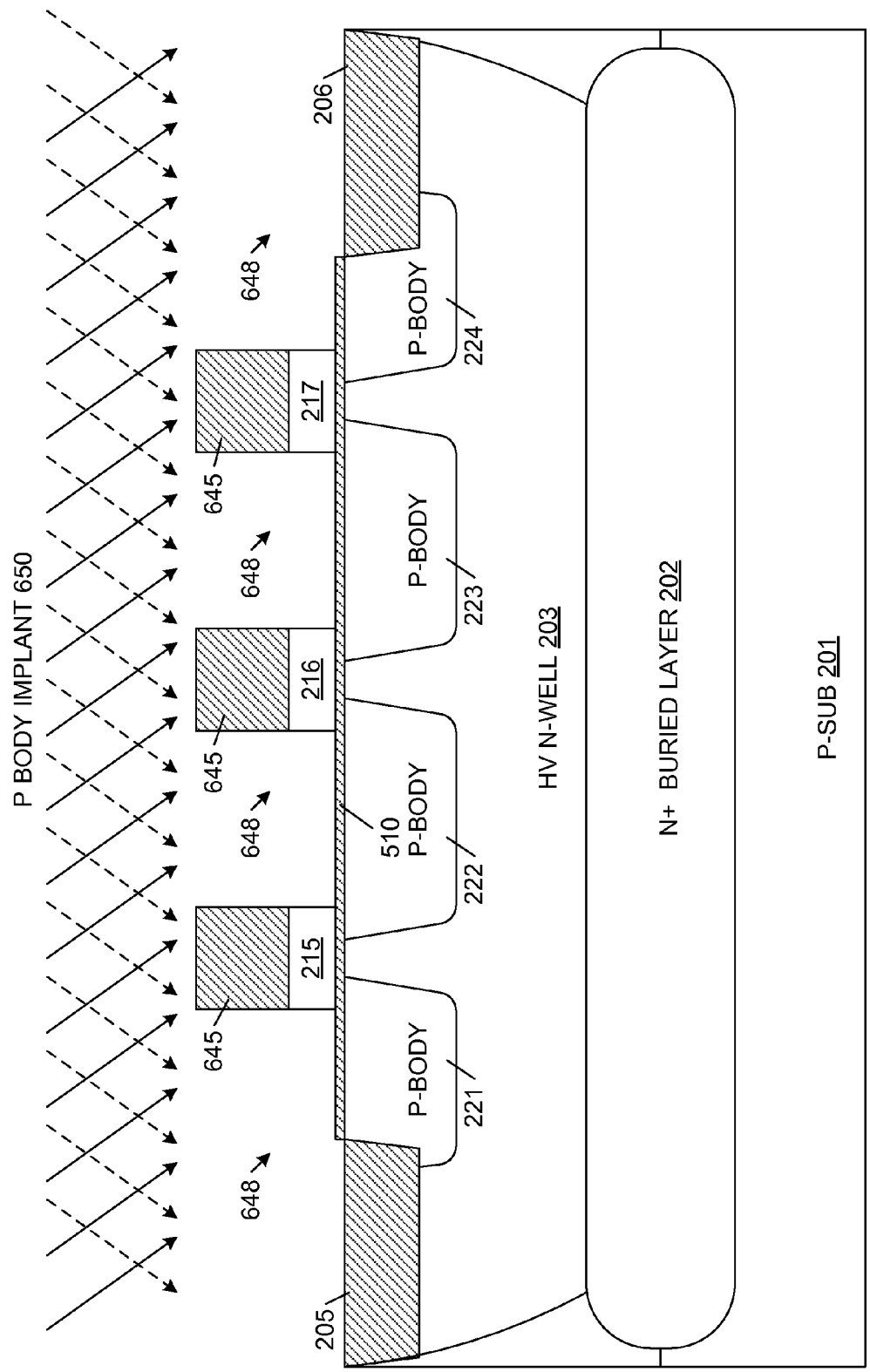
Figure 5J:
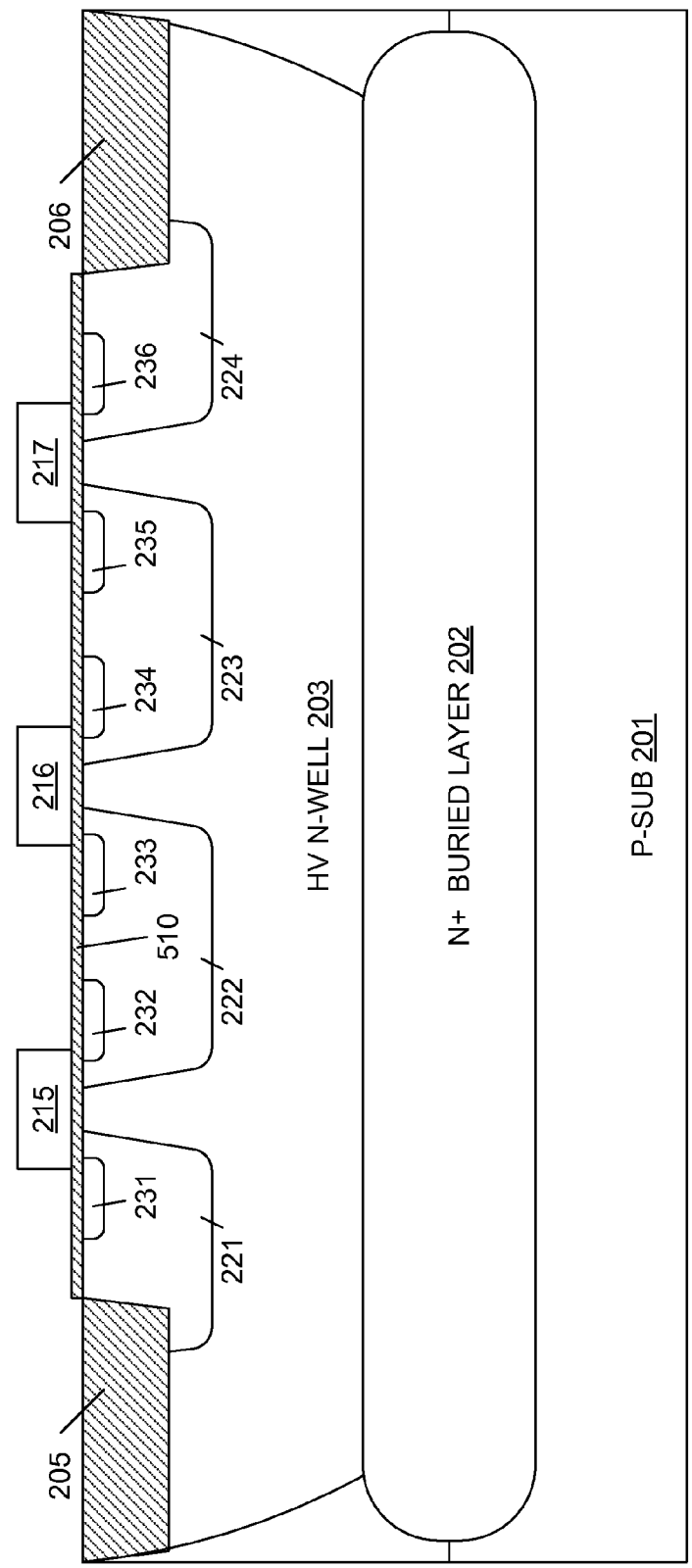
Figure 5K:
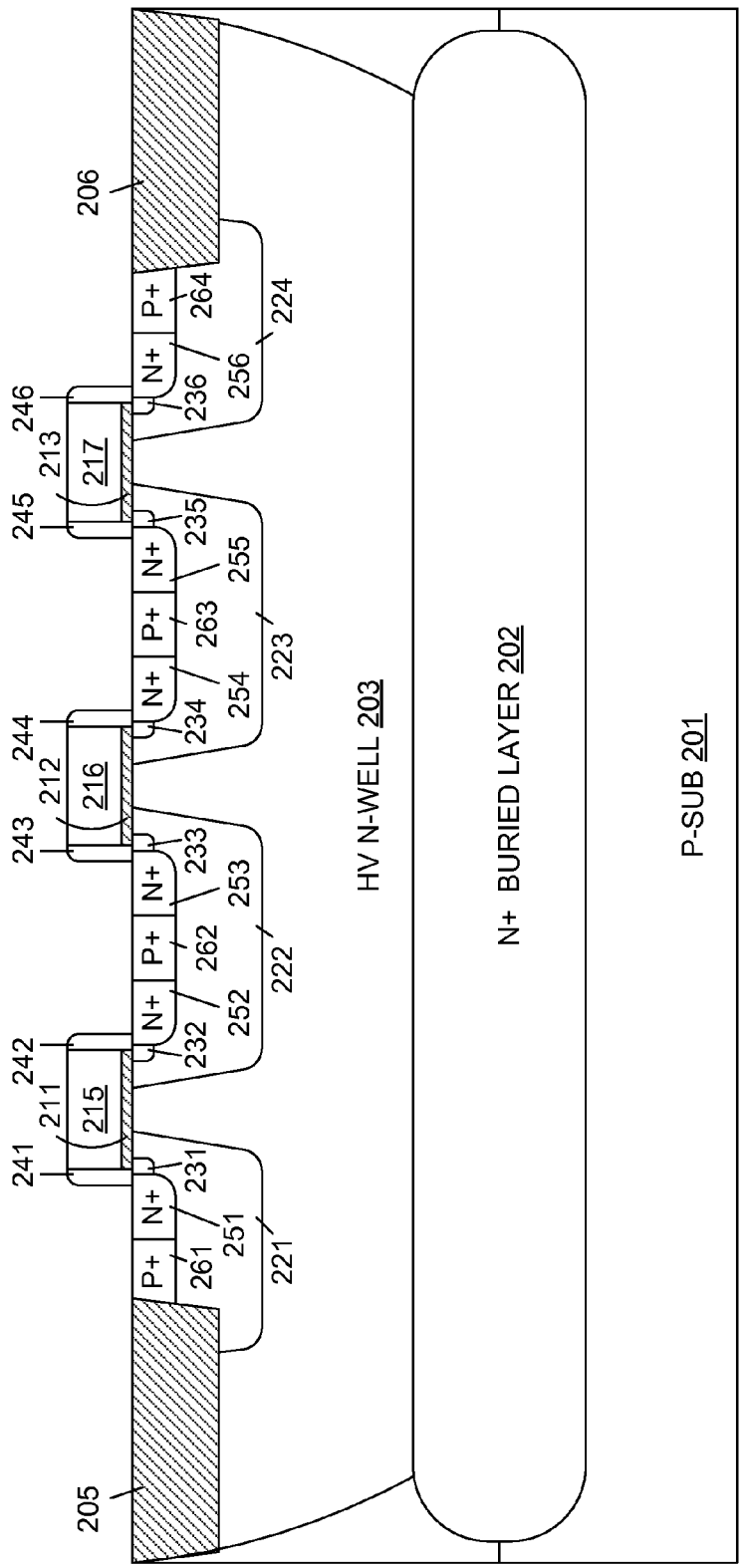
Figure 5L:
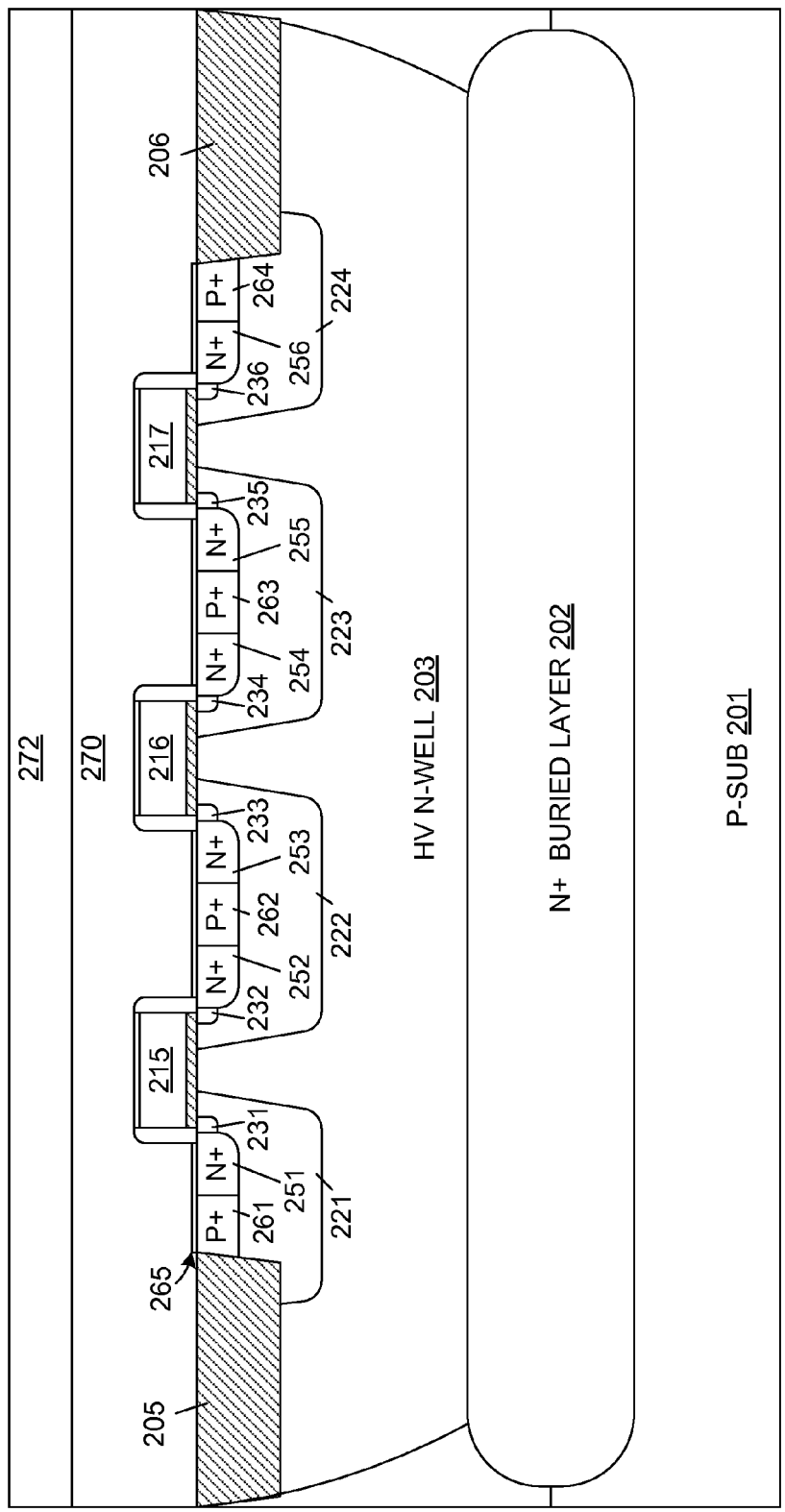
Figure 5M:
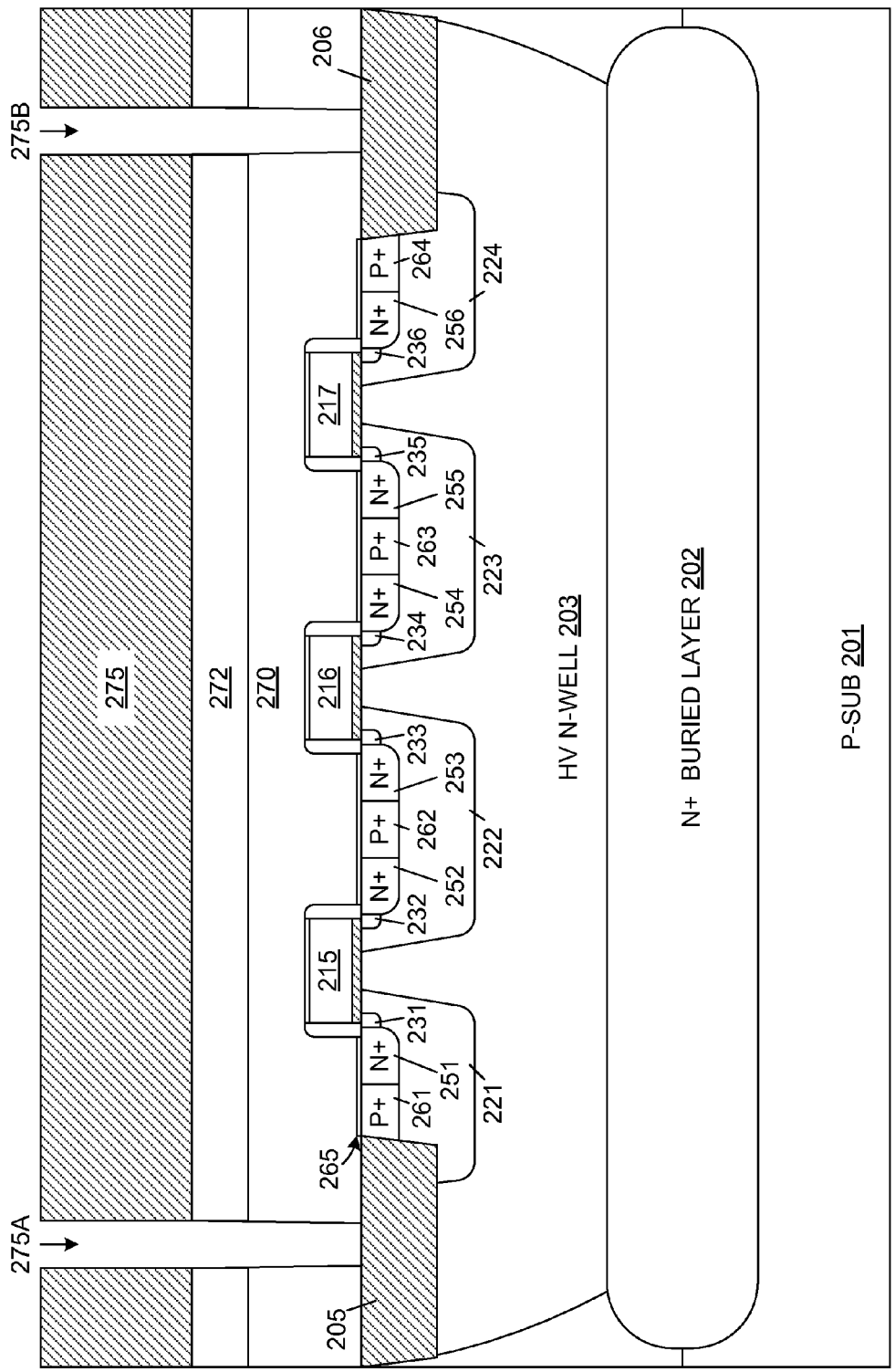
Figure 5N:
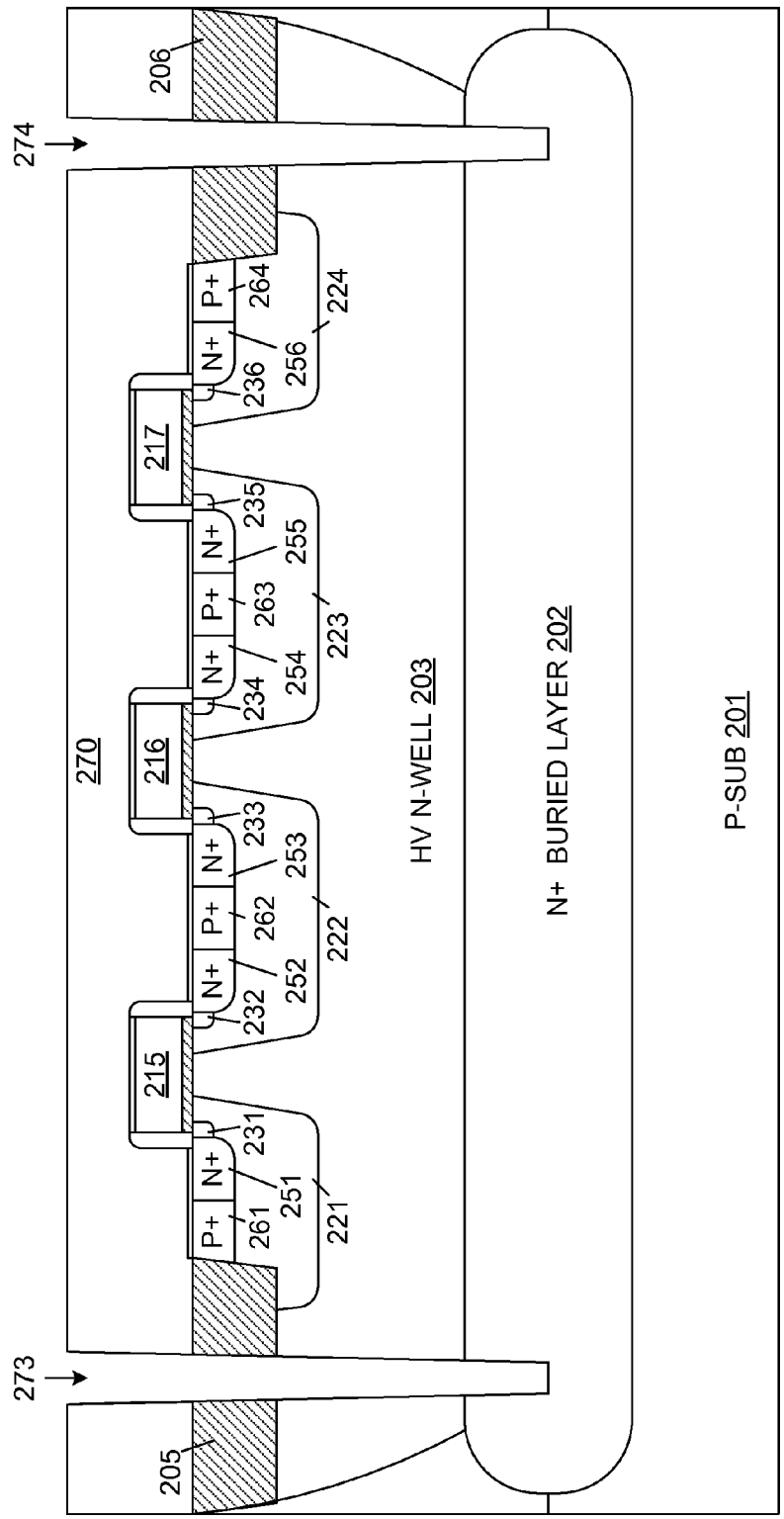
Figure 5O:
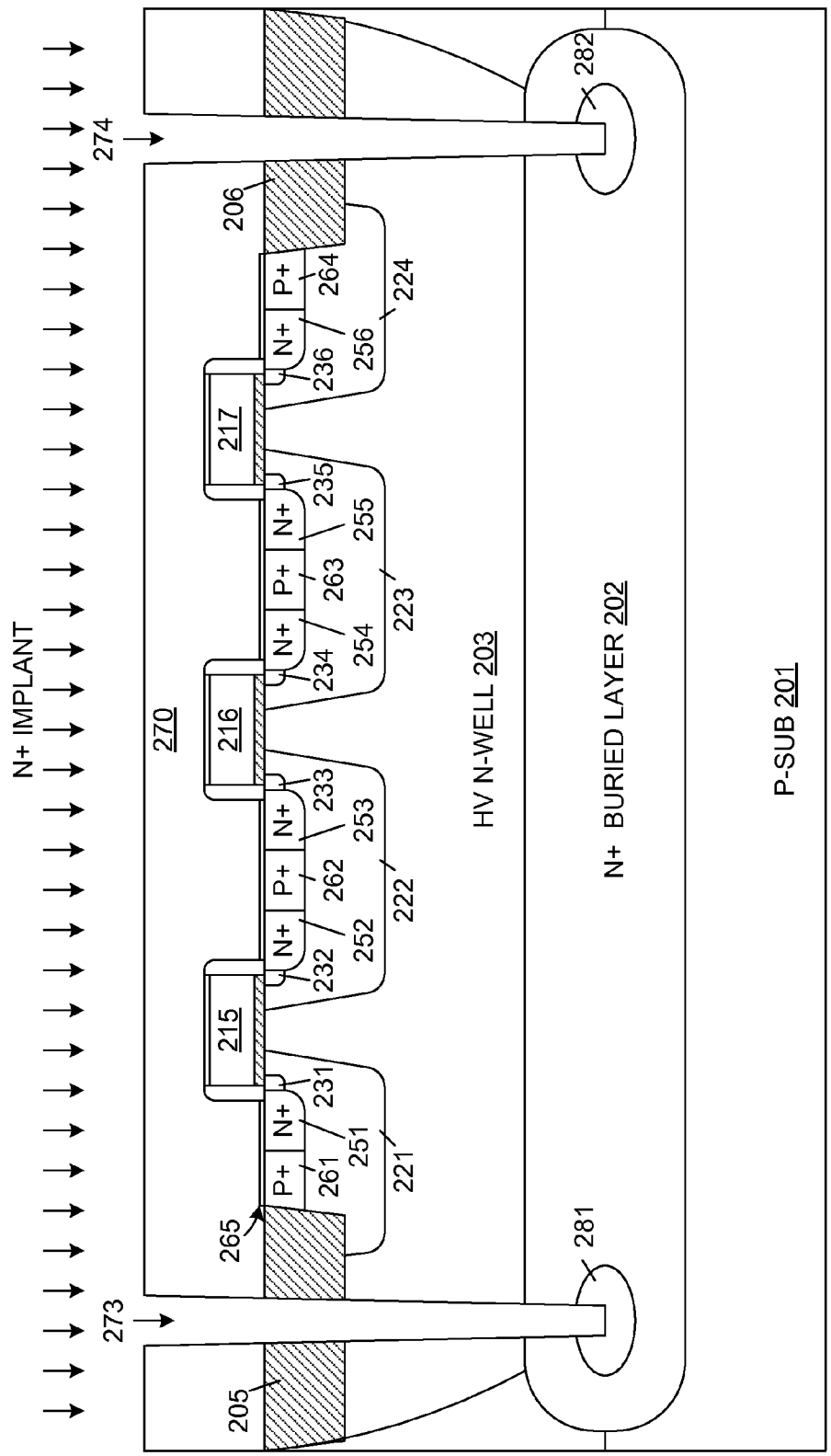
Figure 5P:
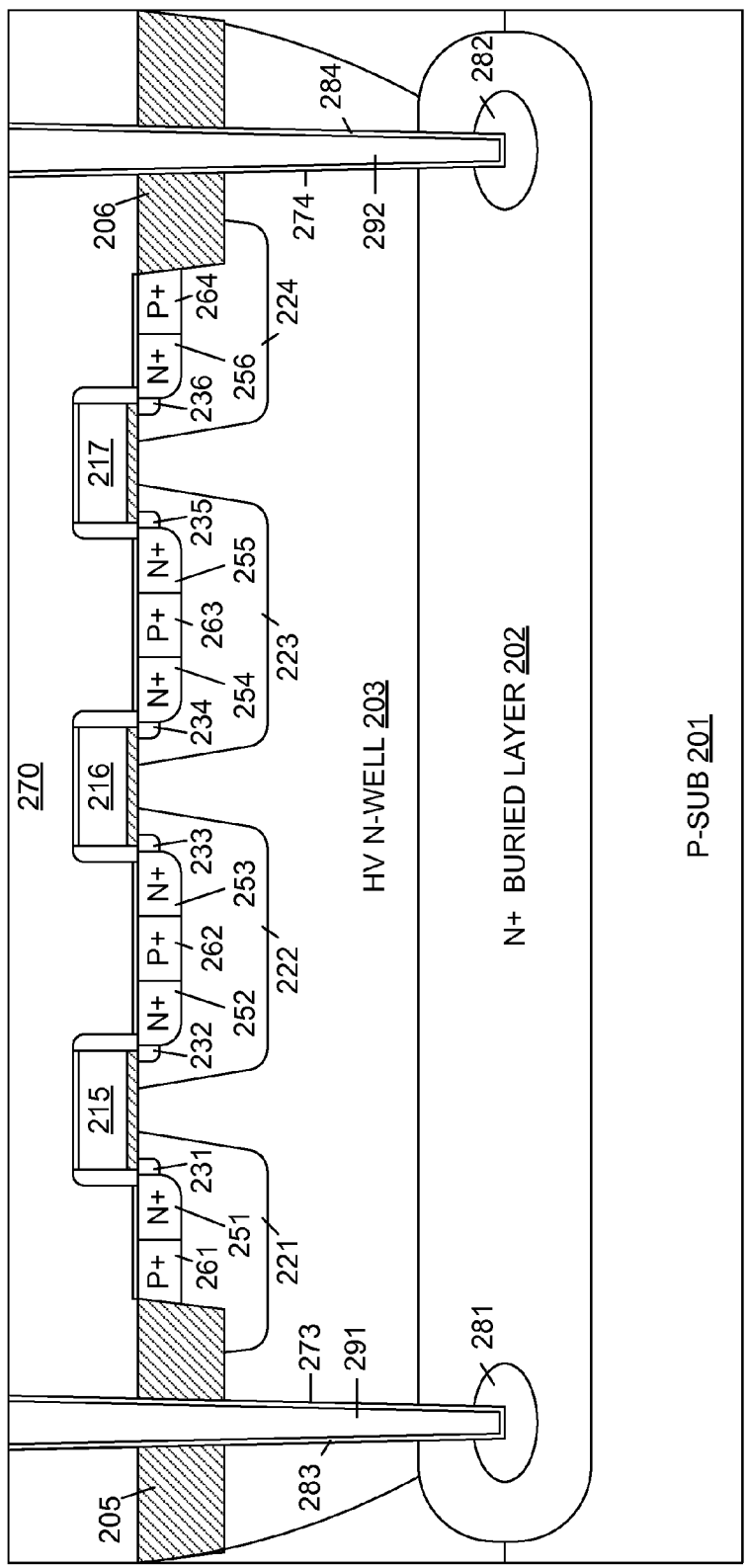

FIGS. 5A-5P are cross sectional views showing a first portion of an integrated circuit chip during various deep sub-micron VLSI fabrication processing steps, wherein vertical DMOS transistor 200 is fabricated in the first portion of the integrated circuit chip in accordance with an embodiment of the present invention.

FIGS. 6A-6K are cross sectional views showing a second portion of the same integrated circuit chip during the process, wherein conventional low-voltage NMOS and PMOS transistors, as well as an N-channel LDMOS device are fabricated in the second portion of the integrated circuit chip.

Figure 6A:
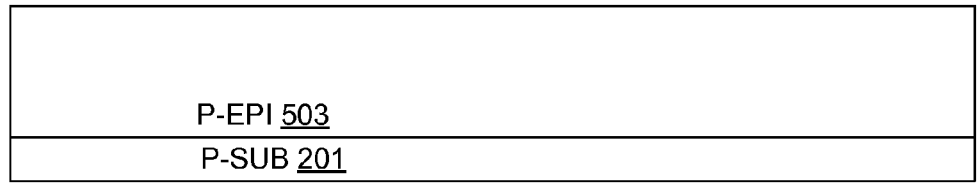
FIGS. 6A-6K are cross-sectional views showing a second portion of the integrated circuit chip of FIGS. 5A-5P during various processing steps, wherein low voltage CMOS transistors and a lateral DMOS transistor are fabricated in the second portion of the integrated circuit chip at the same time that the vertical DMOS transistor is fabricated in the first portion of the integrated circuit chip.

Referring to FIGS. 5A and 6A, the various semiconductor structures are formed on a p-type monocrystalline silicon substrate 201. This substrate 201 can be an epitaxial or non-epitaxial layer. Moreover, this substrate 20 may have an n-type conductivity in an alternate embodiment. Zero layer (ZL) lithography and etch steps (not shown) are performed, thereby forming a pattern of trenches (having an exemplary depth of 1200 Angstroms) that acts as a marking layer for alignment purposes during subsequent process steps.

As illustrated in FIG. 5A, an N+ buried layer mask 501 is formed over the substrate 201 using conventional photolithography. Mask 501 exposes the location where the N+ buried layer 202 is to be formed. An N+ implant is performed through mask 501, thereby forming N+ region 502 in substrate 201. In one embodiment, the N+ implant is performed by implanting Arsenic or Antimony at a dosage of about $3.0e15$ $cm^{-3}$ and an energy of about 70 KeV. Note that the second portion of the integrated circuit chip (where the low voltage CMOS transistors and the LDMOS transistor will be formed) is covered by mask 501.

As illustrated by FIGS. 5B and 6A, the mask 501 is removed, and an epitaxial silicon layer 503 is grown over the resulting structure. In one embodiment, epitaxial silicon layer 503 has a thickness of about 6 microns and a resistivity of about 10 Ohm-cm. Although epitaxial layer 503 has a P-type conductivity in the described embodiments, it is understood that epitaxial layer 503 can have an n-type conductivity in other embodiments. N+ buried layer 202 is formed from the N+ diffusion 502, below the epitaxial layer 503, as illustrated in FIG. 5B. FIG. 6A illustrates the formation of the epitaxial layer 503 over the P-type substrate 201 in the second portion of the integrated chip.

Active area lithography is then performed, wherein the active area lithograph is aligned with the previously formed zero layer patterns. Active area lithography defines the areas where field dielectric regions (e.g., STI regions 205 and 206 in FIG. 2) are formed.

Figure 6B:
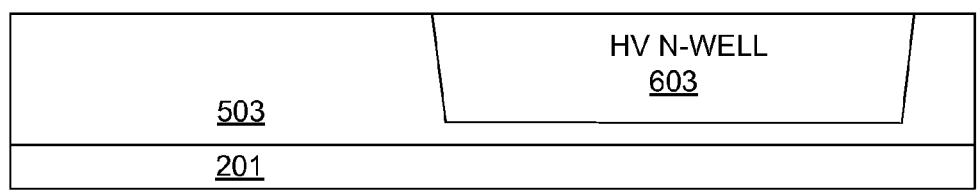

As illustrated in FIGS. 5C and 6B, high voltage N-wells 203 and 603 are simultaneously formed in epitaxial layer 503, by masking, implant, and thermal diffusion according to known techniques. High-voltage N-well 203 extends to N+ buried layer 202. High-voltage N-well 603 is used to form an LDMOS drain N-tub of a fabricated LDMOS transistor.

Figure 6C:
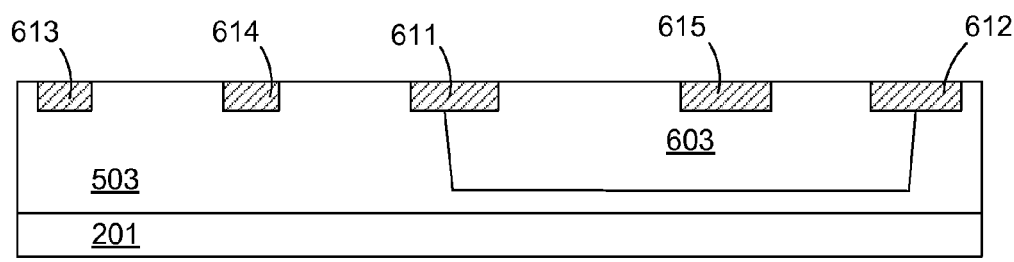

As illustrated by FIGS. 5D and 6C, field dielectric regions 205-206 and 611-615 are simultaneously formed in epitaxial layer 503, using conventional processing steps. Field dielectric regions can be, for example, shallow trench isolation (STI) regions, local oxidation of silicon (LOCOS) regions, or poly buffered local oxidation of silicon (PBLOCOS) regions. Field dielectric regions 205-206 define the location of vertical DMOS device 200 in the manner described above in connection with FIG. 2. Field dielectric regions 611 and 612 are located at opposite edges of N-well 603, and a central oxide region 615 is formed between regions 611 and 612 (i.e., inside N-well 603). Field dielectric regions 611-612 define the location of an LDMOS transistor. Field dielectric regions 613 and 614 are formed in epitaxial layer 503 such that these additional isolation oxide structures are spaced from isolation oxide structures 611 and 612, as shown. As will become apparent from the subsequent disclosure, field dielectric regions 613 and 614 define the location of low voltage PMOS transistors, and field dielectric regions 611 and 614 define the location of low voltage NMOS transistors.

Figure 6D:
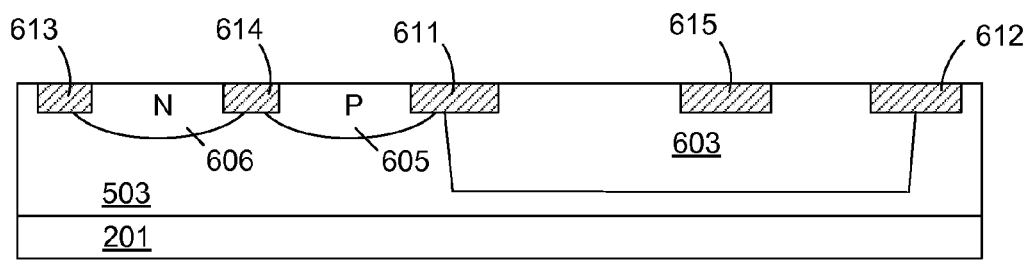

As illustrated by FIG. 6D, low voltage P-type well region (P-well) 605 and a low voltage N-type well region (N-well) 606 are then formed using associated lithographic masks, implants and thermal activation according to known techniques. As shown in FIG. 6D, low voltage P-well 605 is disposed between field dielectric regions 611 and 614, and low voltage N-well 606 is disposed between field dielectric regions 613 and 614. Note that the depicted positions of P-well 605 and N-well 606 and their associated field dielectric regions structures are arbitrary, and these features may be disposed at other locations of epitaxial layer 503.

Figure 6E:
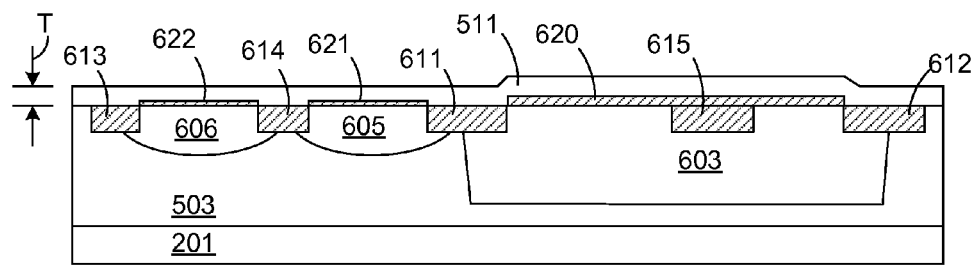

As shown by FIGS. 5E and 6E, a vertical DMOS gate oxide layer 510 is formed over high-voltage N-well 203, an LDMOS gate oxide layer 620 is formed over high-voltage N-well 603, and low-voltage gate dielectric layers 621 and 622 are formed over low voltage P-well 605 and low voltage N-well 606, respectively, using a known combination of oxidation, deposition and selective dielectric etch processes. In one embodiment, vertical DMOS gate dielectric layer 510 is formed using thermal oxidation followed by an oxide deposition process, and has a thickness of about 260 Angstroms. Similarly, LDMOS gate oxide layer 620 is formed using thermal oxidation followed by oxide deposition process and has a thickness of approximately 110 Angstroms. Low-voltage gate dielectric layers 621 and 622 are formed using a thermal oxidation process and have a thickness of approximately 40 Angstroms.

As also shown by FIGS. 5E and 6E, a polysilicon layer 511 having a substantially uniform thickness T (e.g., approximately 0.2 microns) is formed over the field dielectric regions and thin oxide/dielectric layers using known techniques. As used herein, the term "substantially uniform thickness" is intended to mean that polysilicon layer 511 is formed during a single (e.g., deposition) process, whereby variations (if any) in the thickness of polysilicon layer 511 are unintentional and due solely to local effects.

Figure 6F:
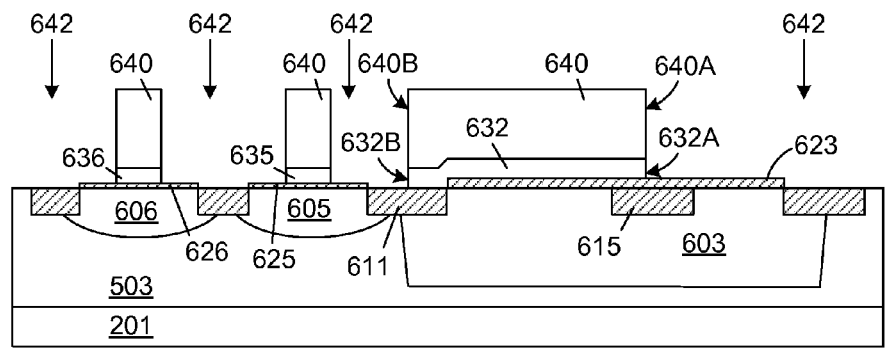

As illustrated by FIGS. 5F and 6F, a first mask 640 is then formed on polysilicon layer 511. First mask 640 is then utilized to etch the polysilicon layer to form various polysilicon structures. In one embodiment, first mask 640 is formed using photoresist material that is deposited, exposed through a reticle, and etched using known photolithographic techniques to form a plurality of openings 642. Note that the various edges of mask 640 that define openings 642 are disposed over corresponding oxide/dielectric layers. For example, mask edge 640A is disposed over field dielectric region 615 and mask edge 640B is disposed over field dielectric region 611. The portions of polysilicon layer 511 that are exposed through openings 642 are then etched according to known techniques, thereby producing an interim (partially formed) LDMOS gate structure 632 disposed over N-well region 603, a NMOS gate structure 635 disposed over P-well region 605, and an PMOS gate structure 636 disposed over N-well region 606. Note that this first poly etch process forms interim LDMOS gate structure 632 such that a first edge 632A is located over oxide region 615, and a second (opposing) edge 632B is located over oxide region 611. As illustrated by FIG. 6F, first mask 640 entirely covers the first portion of the integrated circuit chip where the vertical DMOS transistor 200 is formed. First mask 640 is removed after the first polysilicon etching process is completed.

Figure 6G:
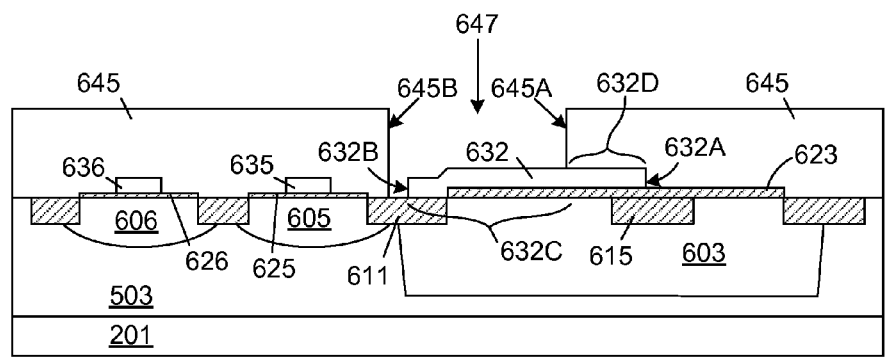

Referring to FIGS. 5G and 6G, a second mask 645 is then patterned in a manner similar to that described above with reference to first mask 640, such that second mask 645 covers NMOS gate structure 635 and PMOS gate structure 636, and defines an opening 647 that exposes a portion 632C of LDMOS gate structure 632. Second mask 645 also includes openings 648 that define the locations of the gate electrodes of the vertical DMOS transistor 200. Note that second mask 645 covers a predetermined portion 632D of LDMOS gate structure 632 that includes first side edge 632A, and portion 632C extends from side edge 645A of mask 645 into opening 647. Note also that a second side edge 645B is disposed over oxide region 611 such that side edge 632B of LDMOS gate structure 632 is exposed, and opening 647 extends over high voltage N-well 603 to a point located between oxide regions 611 and 615. It is important to note here that during this second etching process the low voltage CMOS gates 635 and 636 are protected by the photoresist of second mask 645.

Figure 6H:
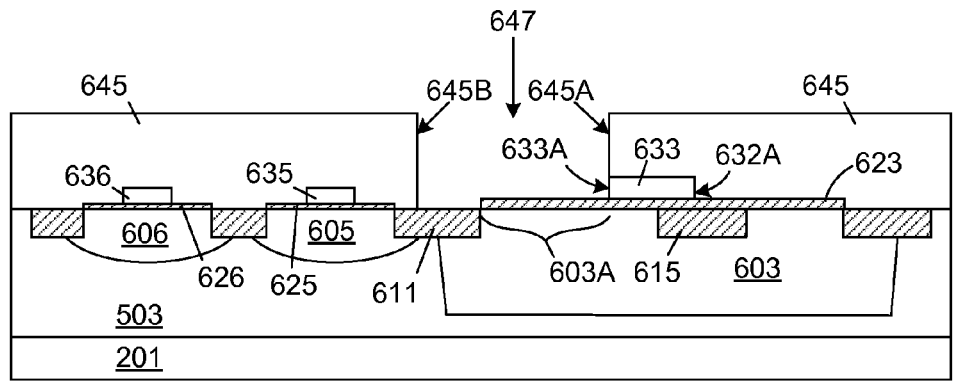

As illustrated by FIGS. 5H and 6H, a second polysilicon etching process is then performed through openings 647 and 648 of the second mask 645 to remove the exposed portions of polysilicon layer 511, (including portion 632C of LDMOS gate structure 632), thereby completing the formation of LDMOS gate structure 633 and vertical DMOS gate electrodes 215-217. Note that the second etching process defines a second edge 633A of LDMOS gate structure 633 (i.e., LDMOS gate structure 633 now extends from first edge 632A, which is covered by second mask 645, to second edge 633A, which is aligned with and exposed through side edge 645A of second mask 645). Note also that second edge 633A of LDMOS gate structure 633 is positioned over N-well region 603 such that a portion 603A of N-well region 603 is exposed through opening 647.

Figure 6I:
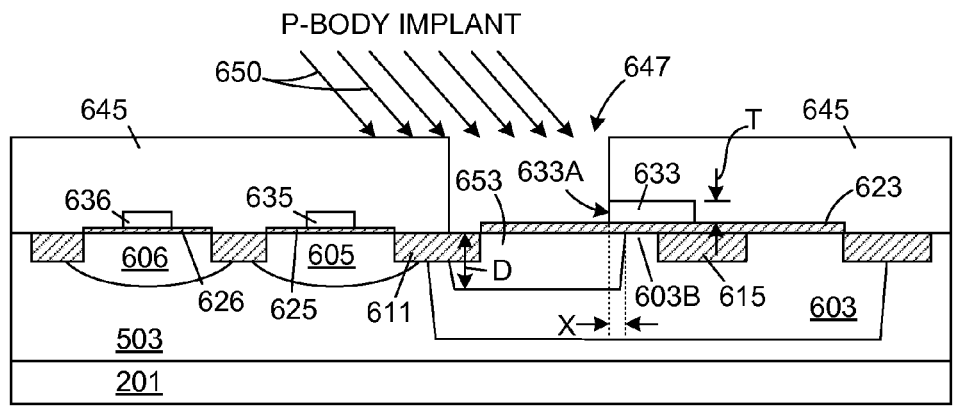

As illustrated by FIGS. 5I and 6I, a P-type dopant 650 is then implanted into high voltage N-wells 203 and 603 through openings 647 and 648 using a high energy implant process. This implant process forms a deep body implant region 653 inside N-well region 603 that extends from first oxide region 611 to a point adjacent to the second edge 633A of LDMOS gate structure 633. This implant process also forms P-body regions 221-224 inside N-well 203.

According to an aspect of the present invention, the high energy implant process is performed at an energy level that is sufficient to form an optimal LDMOS body implant region 653 and optimal P-body regions 221-224, but undesirable doping under LDMOS gate structure 633 and polysilicon gates 215-217 is prevented by second mask 645. As used herein, "high energy implant process" is defined as an implant process performed at an energy level higher than the stopping power of the polysilicon gate electrodes, with thickness T. Under these implant conditions, in the absence of second mask 645, the implanted material would penetrate the polysilicon gate structures 633 and 215-217, and produce undesirable doping under the entire length of the polysilicon gate structures 633 and 215-217. By retaining second mask 645 over LDMOS gate structure 633 and vertical DMOS gate structures 215-217 during the high energy implant process, dopant 650 is prevented from penetrating these gate structures 633 and 215-217, thereby providing a desired undoped regions (e.g., region 603B), which are located under gate structures 633 and 215-217.

In accordance with another aspect of the present invention, by utilizing second mask 645 to define the side edge 633A of LDMOS gate structure 633 and the side edges of vertical DMOS gate electrodes 215-217, and also to perform the high energy implant process, deep body implant region 653 is self-aligned to LDMOS gate structure 633 and P-body regions 221-224 are self-aligned to vertical DMOS gate electrodes 215-217, thereby facilitating a robust production of short-channel devices having low $Rds_{on}$ characteristics.

Referring again to FIGS. 5I and 6I, in accordance with an embodiment of the present invention, the high energy implant process is performed such that dopant material 650 is directed an acute angle relative the surface of N-well regions 203 and 603 (as indicated in the figure) such that deep implant regions 653 and 221-224 extend a predetermined distance X under the edges of LDMOS gate structure 633 and vertical DMOS gate structures 215-217. Those skilled in the art will recognize that this gate overlap facilitates optimal LDMOS and vertical DMOS operating characteristics. In particular, the overlap of P-body regions 653 and 221-224 under gate electrodes 633 and 215-217 form the channel regions where a conductive inversion layer is formed when the transistors are in an "on" state. The effective channel length is defined by this overlap, and this effective channel length is a prime parameter defining LDMOS and vertical DMOS transistor characteristics. Second mask 645 is removed after the second polysilicon etching process is completed.

Figure 6J:
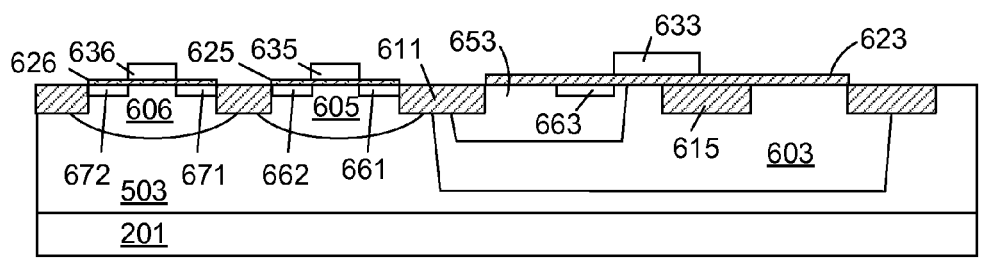

FIGS. 5J and 6J illustrate the low voltage CMOS transistors, LDMOS transistor and vertical DMOS transistor after subsequent n-type light doping processes are performed to provide low-voltage CMOS, LDMOS and vertical DMOS source/drain extension implants. An N-type dopant is implanted using a corresponding mask (not shown) to form lightly doped regions 231-236 in P-body regions 221-224, such that each of the lightly doped regions 231-236 is aligned with a corresponding edge of the gate electrodes 215-217, as illustrated. The N-type dopant further forms lightly doped region 663 in deep implant region 653 such that one end of lightly doped region 663 is disposed adjacent to (e.g., aligned with) second edge 633A LDMOS gate structure 633, and lightly doped region 663 extends from LDMOS gate structure 633 toward oxide region 611. Note that N-type extension regions 661 and 662 are simultaneously formed in P-well 605 on opposite sides of gate structure 635. During a second implant process using corresponding masks (not shown), P-type extension regions 671 and 672 are formed in N-well 606 on opposite sides of gate structure 636.

Figure 6K:
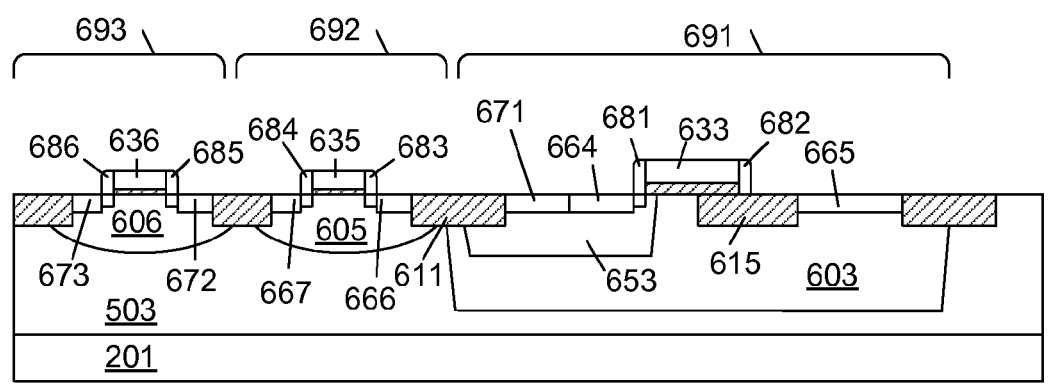

Next, as shown in FIGS. 5K and 6K, spacer structures are formed adjacent to each of the polysilicon gate structures, and heavily doped source/drain and body contact regions are formed in each of the corresponding diffusions. Thus, dielectric sidewall spacers 241-246 are formed adjacent to polysilicon gate electrodes 215-217, as illustrated. Dielectric sidewall spacers 681 and 682 are formed on opposite sides of LDMOS gate structure 633; dielectric sidewall spacers 683 and 684 are formed on opposite sides of NMOS gate structure 635; and, dielectric sidewall spacers 685 and 686 are formed on opposite sides of PMOS gate structure 636 using known techniques.

Next, and N+ implant is performed through a corresponding mask (not shown), to simultaneously form N+ source contact regions 251-256 in P-body regions 221-224 (FIG.

5K); N+ source contact region 664 in P-body region 653; N+ drain region 665 in high voltage N-well 603; and, N+CMOS source/drain contact regions 666-667 in P-well 605. Subsequent to (or before) this N+ implant, a P+ implant is performed through a corresponding mask (not shown), to simultaneously form P+ body contact regions 261-264 in P-body regions 221-224, respectively; P+ body contact region 671 in P-body region 653; and P+CMOS source/drain implants 672-672 in N-well 606. Note that FIG. 6K illustrates the substantially completed LDMOS transistor 691, low voltage NMOS transistor 692 and low voltage PMOS transistor 693.

After the N+ and P+ implants are completed, the deep sub-micron VLSI fabrication process proceeds with salicide blocking layer deposition and mask lithography, followed by salicidation processing according to known techniques, thereby forming salicide structures 265 of vertical DMOS transistor 200, and similar salicide structures (not shown) on the exposed silicon/polysilicon regions of LDMOS transistor 691, NMOS transistor 692 and PMOS transistor 693. Because the further processing of LDMOS transistor 691, NMOS transistor 692 and PMOS transistor 693 is substantially conventional (with exceptions noted below in connection with the further fabrication of vertical DMOS transistor 200), the further processing of transistors 691-693 is not described in detail.

As illustrated in FIG. 5L, pre-metal dielectric (PMD) layer 270 is formed over the resulting structure, and a conventional chemical-mechanical processing (CMP) step is performed, thereby planarizing the upper surface of PMD layer 270. As also illustrated in FIG. 5L, a sacrificial dielectric layer 272 (e.g., CVD $SiO_2$) is deposited over PMD layer 270. The thickness of sacrificial dielectric layer 272 is selected such that this layer is partially or entirely consumed during the subsequent processing steps used to form deep silicon via plugs 291-292.

As illustrated by FIG. 5M, a deep silicon via mask 275 is formed over sacrificial dielectric layer 272 by conventional photolithography steps. Deep silicon via mask 275 includes openings 275A and 275B, which define the locations where deep silicon via plugs 291-292 are subsequently formed. An etch is performed through openings 275A-275B of deep silicon via mask 275, wherein this etch forms openings that extend through sacrificial dielectric layer 272 and PMD layer 270.

As illustrated in FIG. 5N, deep silicon via mask 275 is stripped, and a deep silicon via etch is performed through the openings previously formed through sacrificial dielectric layer 272 and PMD layer 270. This deep silicon via etch forms deep trenches 273-274, which extend through field dielectric regions 205-206, respectively, and further extend through high-voltage N-well 203 and into N+ buried layer 202. Note that sacrificial dielectric layer 272 is partially or entirely consumed during this deep silicon via etch. In an alternate embodiment, sacrificial dielectric layer 272 is not used, and deep trenches 273-274 are formed using a Bosch etching process through a photoresist mask formed on the pre-metal dielectric layer 270.

As illustrated in FIG. 5O, an N+ implant is performed into deep trenches 273-274, thereby forming N+ regions 281-282 and introducing the N+ impurity to the walls of the deep trenches 273-274. In the described embodiments, the species of the N+ implant can be arsenic (As) or phosphorus (P). The N+ impurity implanted into the walls of the deep trenches 273-274 enable the subsequent formation of ohmic contacts inside of these deep trenches 273-274. In one embodiment, an anneal may be performed immediately after the N+ impurity is implanted. In another embodiment, the N+ implant of FIG. 5O is not performed (i.e., this N+ implant is optional).

Turning now to FIG. 5P, a thin metal liner (e.g., Ti/TiN) is deposited over the resulting structure, i.e., into deep trenches 273-274. A anneal step is then performed, by heating to a temperature high enough to lead to the activation of the implanted species. This anneal also results in silicide formation (and anneals the TiN in the instance where the TiN is formed by a CVD process). Chemical vapor deposition (CVD) of tungsten (W) is then performed to fill the deep trenches 273-274. A CMP step is then performed to remove the portions of the tungsten layer (and the thin metal linger) that are not located in the deep trenches 273-274. This CMP steps leaves thin metal liners 283-284 and deep silicon via plugs 291-292 in deep trenches 273-274, and planarizes the upper surface of PMD layer 270, as illustrated by FIG. 5P. From this point, standard PMD photolithography/etch processing is used to create the conventional conductive contacts 271 through PMD layer 270, thereby providing connections to the various source/drain regions (as well as gate electrodes) of the various transistors 200 and 691-693. The first metal layer (which includes traces 293-295 as shown in FIG. 2), as well as the rest of a multi-layer interconnect structure (not shown) is then formed, thereby providing other connections understood by those of ordinary skill in the art.

The above-described process advantageously allows vertical DMOS transistor 200, LDMOS transistor 691 and low voltage CMOS transistors 692-693 to be fabricated on the same integrated circuit chip using a process that is largely compatible with a deep sub-micron VLSI fabrication process. It is understood that other conventional devices, such as bipolar transistors, diodes, resistors and capacitors, could simultaneously be fabricated on the same chip using the above-described process.

Figure 7:
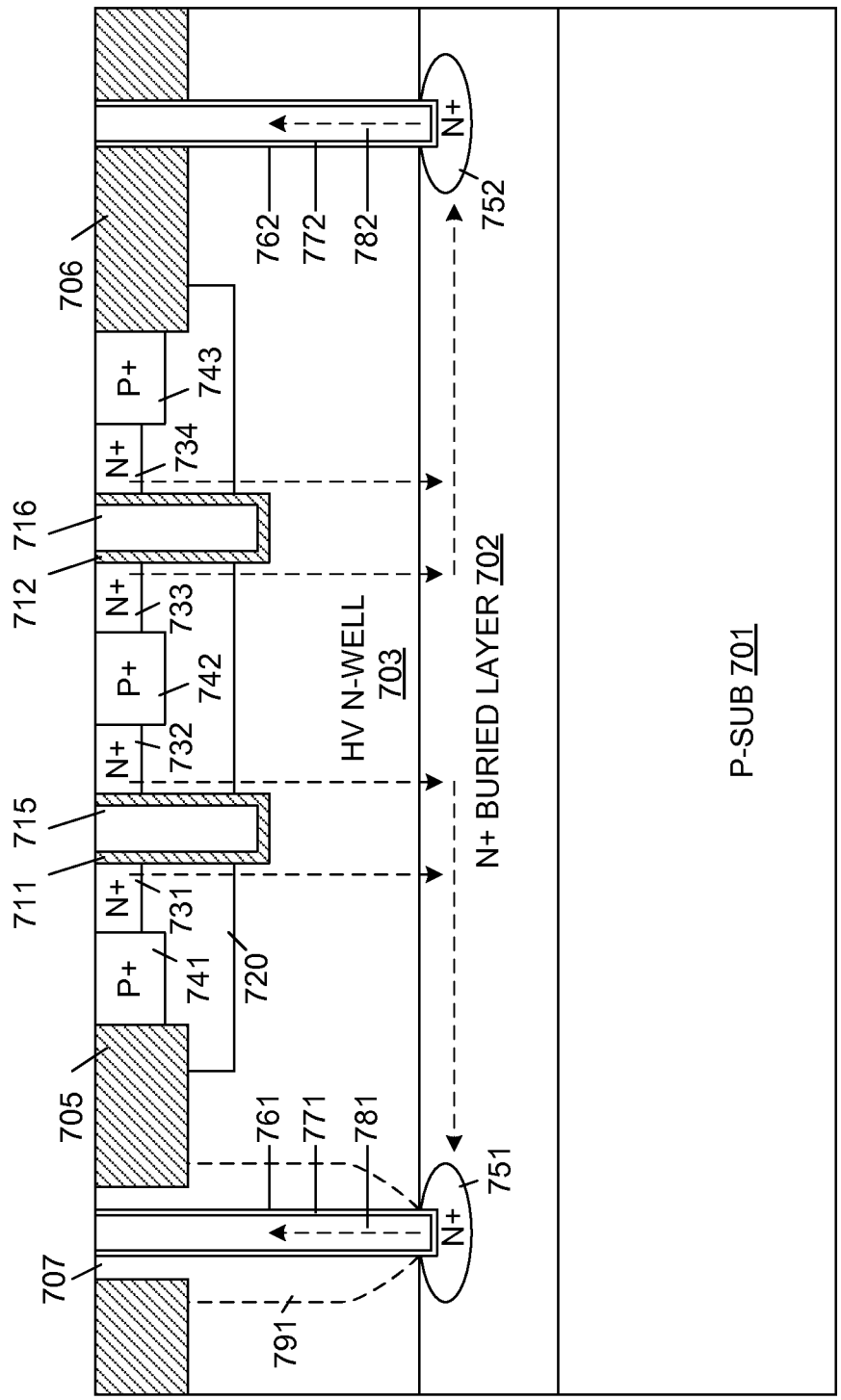
FIG. 7 is a cross-sectional view of a vertical DMOS device in accordance with an alternate embodiment of the present invention.

FIG. 7 is a cross-sectional view of a vertical DMOS device 700 in accordance with an alternate embodiment of the present invention. Vertical DMOS device 700 includes P-type semiconductor region 701, N+ buried layer 702, high voltage (HV)N-well 703, field isolation regions 705-706, gate dielectric regions 711-712, gate electrodes 715-716, P-type body region 720, N+ source contact regions 731-734, P+ body contact regions 741-743, N+ deep silicon diffusion regions 751-752, deep trenches 761-762, deep trench liners 771-772, deep silicon via plugs 781-782, and optional diffused sinker region 791. Although vertical DMOS device 700 is described with certain regions having n-type and p-type conductivity, it is understood that these conductivity types can be reversed in alternate embodiments.

In the described examples, p-type semiconductor region 701, N+ buried layer 702, high voltage N-well 703 and field isolation regions 705-706 are substantially identical to similar structures described above in connection with FIG. 2. Field isolation regions 705-706 define boundaries of the p-body region 720. P-body region 720 is formed in high-voltage N-well 703 in a manner known to those of ordinary skill in the art. Gate dielectric regions 711-712 are formed on the sidewalls of vertical trenches that extend through P-body region 720. Polysilicon gate electrodes 715-716 are formed over the gate dielectric regions 711-712, within the same vertical trenches. Although two gate electrodes are illustrated in FIG. 7, it is understood that other numbers of gate electrodes can be included in other embodiments. N+ source regions 731-734 are located adjacent to gate dielectric regions 711-712, within P-body region 720. P+ body contact regions 741-743 are located in P-body region 720, and abut N+ source regions 731-734 as illustrated.

N+ deep diffusion regions 751-752 are located in buried N+ buried layer 702, as illustrated. In general, N+ deep diffusion regions 751-752 are formed by performing a high dose N+ implant into deep trenches 761-762 that extend through field isolation regions 705-706, high-voltage N-well 703 and into N+ buried layer 702. Note that the deep trenches of the present invention can extend through field isolation regions (as trench 762 extends through field isolation region 706), or through active areas (as trench 761 extends through an active area 707 defined by field isolation region 705). During silicidation, the deep trench 761 formed in the active area 707 is blocked by a mask, thereby preventing the formation of silicide in the deep trench 761. In one embodiment, the implant that forms N+ deep diffusion regions 751-752 can be slightly tilted (e.g., by about 3 degrees) to dope the sidewalls of trenches 761-762 (and form the diffusion sinker 791) Deep silicon trench liners 771-772 and deep silicon via plugs 781-782 are located in the deep trenches 761-762, as illustrated. In accordance with one embodiment, deep silicon trench liners 771-772 are thin metal liners (e.g, Ti/TiN), and deep silicon via plugs 781-782 are tungsten plugs. Although not illustrated in FIG. 7, it is understood that deep silicon via plugs 781-782 may extend through a pre-metal dielectric layer in the same manner as deep silicon via plugs 291-292 (FIG. 2).

In general, vertical DMOS device 700 operates as follows. Vertical DMOS device 700 is placed in a conductive state (i.e., turned on) by applying a voltage of about 5 Volts to the gate electrodes 715-716, a source voltage of about 0 Volts to N+ source regions 731-734 and P+ body contact regions 741-743, and a drain voltage of about 0.1 Volts to deep silicon via plugs 781-782. Under these conditions, current flows along the paths indicated by the dashed lines in FIG. 7. That is current flows vertically from the N+ source regions 731-734 through the P-body region 720, into the high voltage N-well 703 and into the N+ buried layer 702, as illustrated. The current then flows through N+ buried layer 702 and into deep silicon via plugs 781-782. Deep silicon via plugs 781-782 exhibit the same advantages as deep silicon via plugs 291-292 (FIG. 2).

In accordance with one embodiment, vertical DMOS device 700 can be laid out in the manners described above in connection with FIGS. 3 and 4. In accordance with another embodiment, vertical DMOS device 700 can be fabricated in a manner similar to that described above in connection with FIGS. 5A-5P (although an additional etch is required to form the trenches for gate electrodes 715-716).

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A semiconductor device comprising:
   a first semiconductor well region having a first conductivity type;
   a conductively doped buried layer located below, and continuous with, the first semiconductor well region, wherein the conductively doped buried layer has the first conductivity type;
   a metal via plug that extends through the first semiconductor well region and into the conductively doped buried layer;
   a metal liner layer located between the metal via plug and the first semiconductor well region, wherein the metal liner layer contacts the first semiconductor well region;
   a plurality of body regions located in the first semiconductor well region, wherein the plurality of body regions have a second conductivity type, opposite the first conductivity type;
   a contact region located in each of the body regions, wherein each contact region has the second conductivity type;
   one or more source regions located in each of the body regions, wherein each of the one or more source regions has the first conductivity type; and
   a polysilicon gate electrode that includes a plurality of polygonal openings.

2. The semiconductor device of claim 1, further comprising polysilicon gate electrodes that extend over the first semiconductor well region, the body regions and the source regions.

3. The semiconductor device of claim 2, wherein each of the polysilicon gate electrodes has a rectangular shape, and wherein the polysilicon gate electrodes are laid out in parallel.

4. The semiconductor device of claim 1, wherein the plurality of polygonal openings include a first polygonal opening, wherein one of the body regions, one of the contact regions and one of the source regions is located within the first polygonal opening.

5. The semiconductor device of claim 4, wherein the plurality of polygonal openings include a second polygonal opening, wherein the metal via plug extends through the second polygonal opening.

6. The semiconductor device of claim 1, further comprising a diffusion region of the first conductivity type located in the conductively doped buried layer, adjacent to the metal via plug.

7. The semiconductor device of claim 1, further comprising a field insulating structure that extends into the first semiconductor well region, wherein the field insulating structure defines the location of the semiconductor device, and wherein the metal via plug extends through the field insulating structure.

8. The semiconductor device of claim 7, further comprising a pre-metal dielectric layer located over the field insulating structure, wherein the metal via plug extends through the pre-metal dielectric layer.

9. The semiconductor device of claim 7, further comprising a diffusion region having the first conductivity type that laterally surrounds the metal via plug within the first semiconductor well region.

* * * * *